(12) United States Patent
Derhacobian et al.

(10) Patent No.: US 8,947,913 B1
(45) Date of Patent: Feb. 3, 2015

(54) CIRCUITS AND METHODS HAVING PROGRAMMABLE IMPEDANCE ELEMENTS

(75) Inventors: Narbeh Derhacobian, Belmont, CA (US); Ishai Naveh, San Jose, CA (US)

(73) Assignee: Adesto Technologies Corporation, Sunnyvale, CA (US)

( * ) Notice: Subject to any disclaimer, the term of this patent is extended or adjusted under 35 U.S.C. 154(b) by 345 days.

(21) Appl. No.: 13/114,192

(22) Filed: May 24, 2011

Related U.S. Application Data

(60) Provisional application No. 61/347,749, filed on May 24, 2010.

(51) Int. Cl.
*G11C 11/00* (2006.01)

(52) U.S. Cl.
USPC ............................. 365/158; 365/148

(58) Field of Classification Search
USPC ......................... 365/148, 154, 158
See application file for complete search history.

(56) References Cited

U.S. PATENT DOCUMENTS

| | | | |
|---|---|---|---|
| 5,761,115 A | 6/1998 | Kozicki et al. | |
| 6,487,106 B1 | 11/2002 | Kozicki | |
| 6,635,914 B2 | 10/2003 | Kozicki et al. | |
| 6,972,427 B2 | 12/2005 | Roehr et al. | |
| 7,215,564 B2 | 5/2007 | Happ et al. | |
| 7,215,568 B2 | 5/2007 | Liaw et al. | |
| 7,251,152 B2 | 7/2007 | Roehr | |
| 7,277,312 B2 | 10/2007 | Liaw | |
| 7,289,350 B2 | 10/2007 | Roehr | |
| 7,332,377 B2 | 2/2008 | Happ et al. | |
| 7,359,236 B2 | 4/2008 | Gilbert | |
| 7,402,847 B2 | 7/2008 | Kozicki et al. | |
| 7,411,815 B2 | 8/2008 | Gogl | |
| 7,414,257 B2 | 8/2008 | Happ et al. | |
| 7,423,281 B2 | 9/2008 | Rohr | |
| 7,423,906 B2 | 9/2008 | Symanczyk | |
| 7,436,694 B2 | 10/2008 | Berthold et al. | |
| 2003/0112676 A1* | 6/2003 | Ooishi | 365/201 |
| 2004/0057281 A1* | 3/2004 | Ooishi | 365/173 |
| 2006/0181916 A1 | 8/2006 | Roehr | |
| 2007/0041242 A1 | 2/2007 | Okazaki et al. | |
| 2007/0121369 A1 | 5/2007 | Happ | |
| 2007/0211528 A1 | 9/2007 | Liaw | |
| 2007/0242496 A1 | 10/2007 | Hoffmann et al. | |
| 2008/0049531 A1 | 2/2008 | Kund | |
| 2008/0079047 A1 | 4/2008 | Schmid | |
| 2008/0198655 A1 | 8/2008 | Keller | |
| 2010/0188879 A1 | 7/2010 | Sasaki | |
| 2010/0265757 A1 | 10/2010 | Otsuka | |

* cited by examiner

*Primary Examiner* — Anthan Tran

(57) ABSTRACT

Integrated circuit (IC) devices are disclosed that include programmable impedance elements (elements) as data storage element. In some embodiments, IC devices can include latch circuit with one or more elements that establish a function of an associated circuit. In other embodiments, IC devices can include elements arranged in a cross-point array connected to control terminals of access devices. In still other embodiments, a memory device can include a programmable address decoder. Corresponding methods are also disclosed.

36 Claims, 24 Drawing Sheets

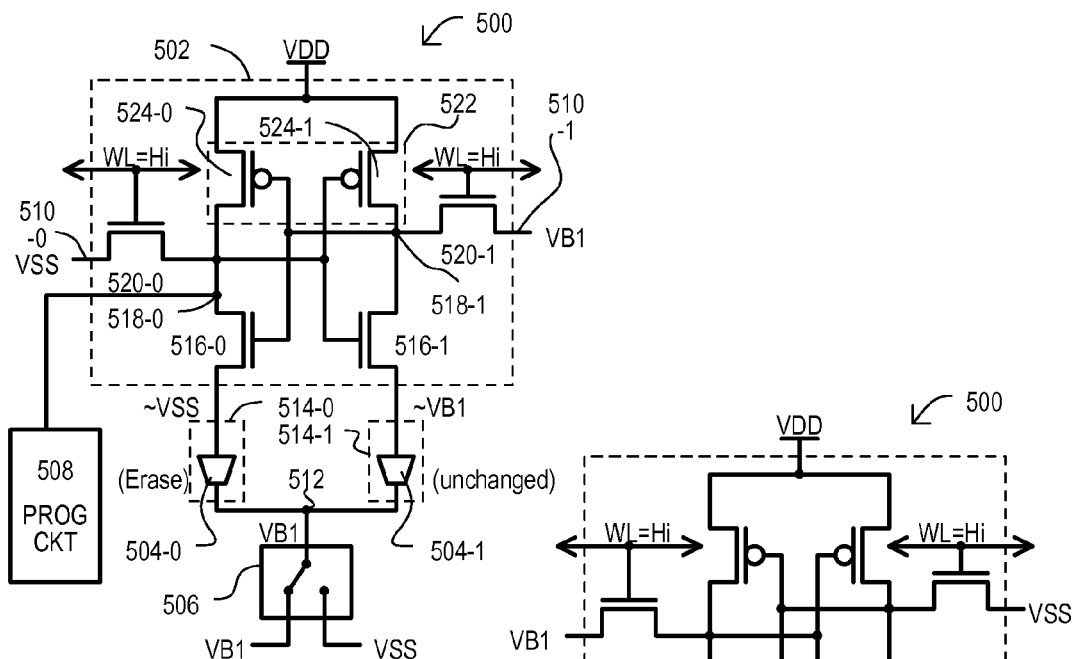
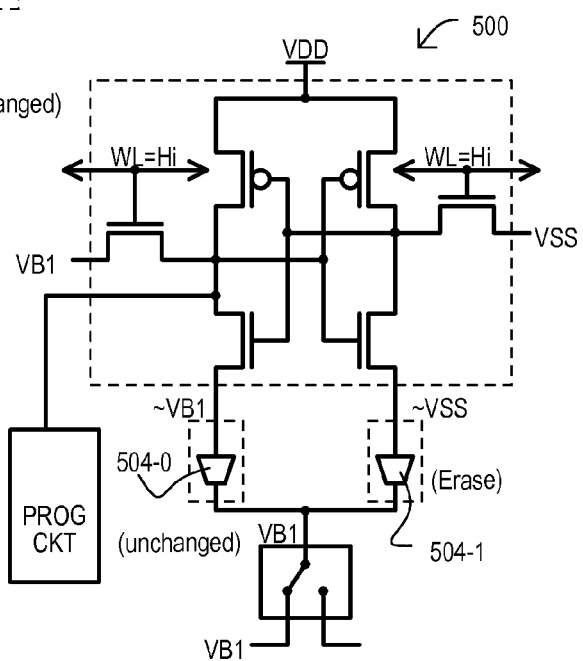
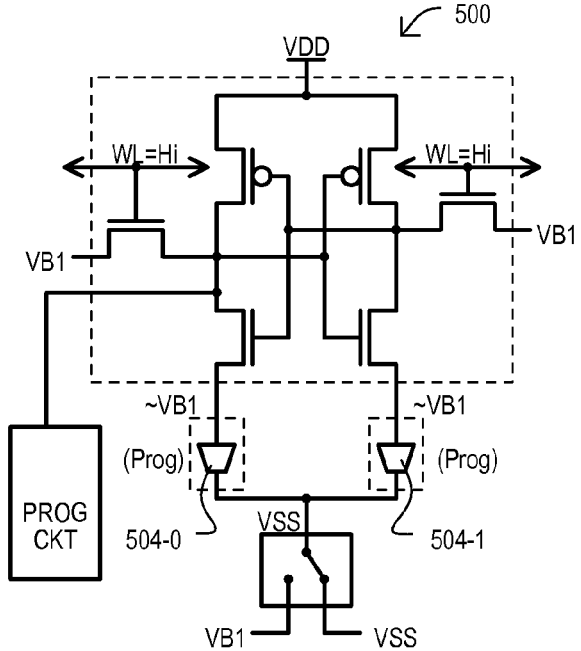
FIG. 5A
FIG. 5B
FIG. 5C

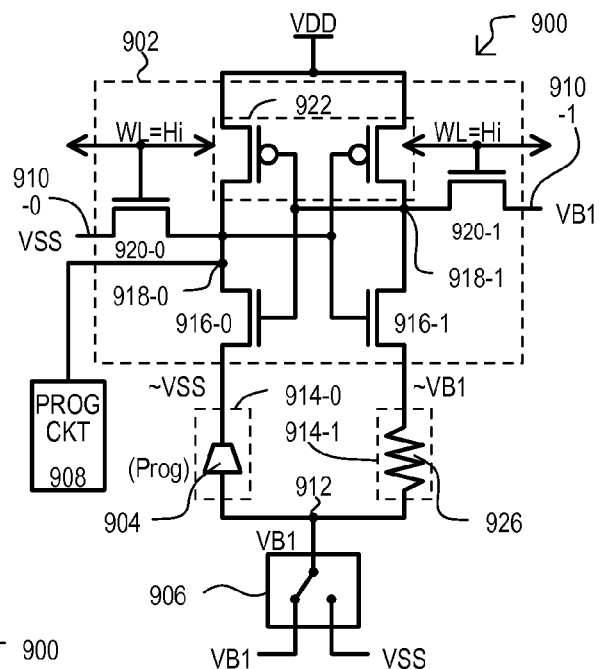
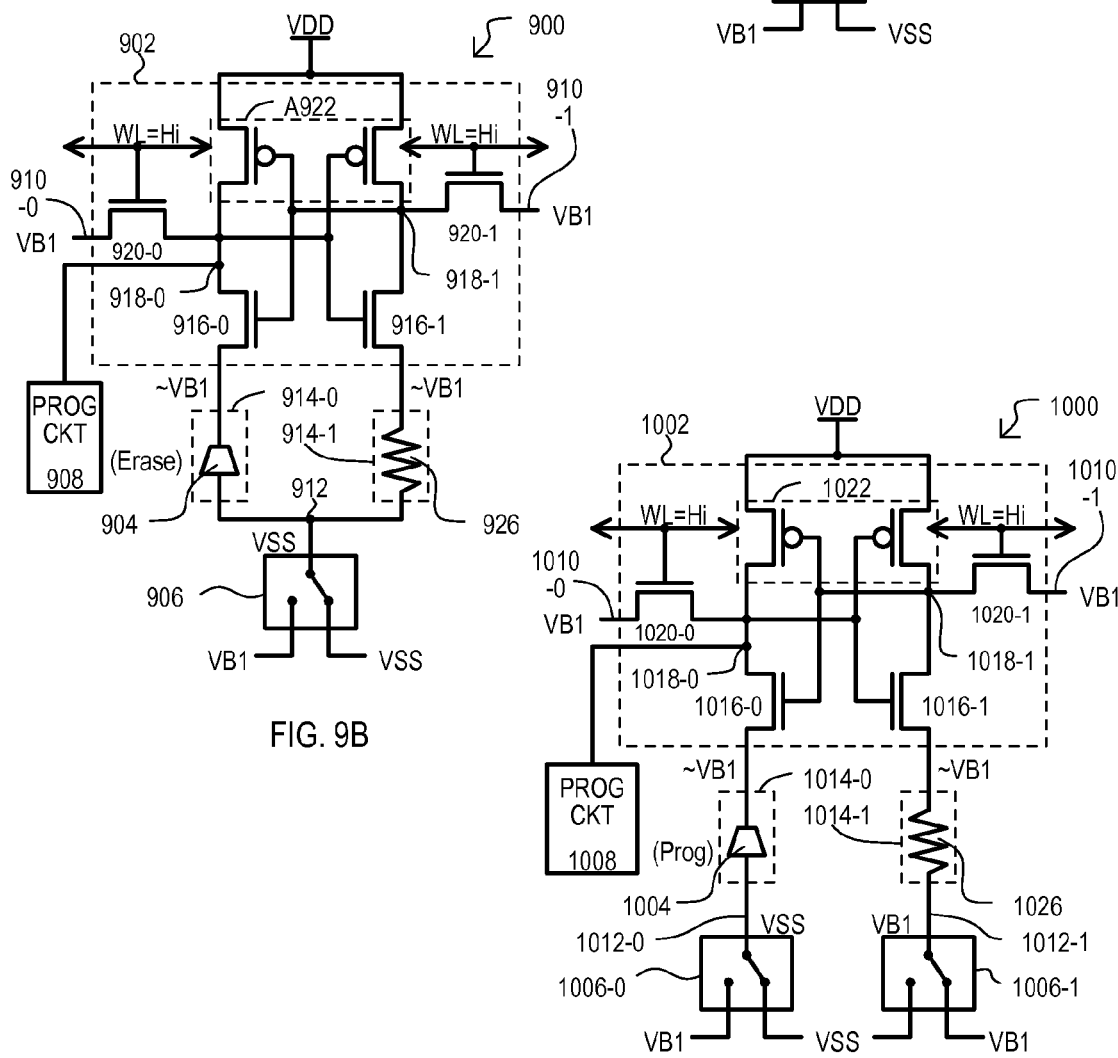
FIG. 9A
FIG. 9B
FIG. 10

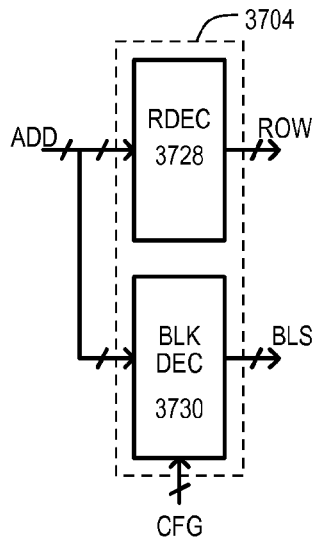
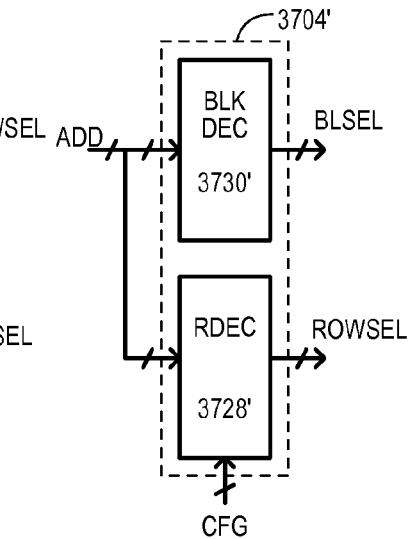
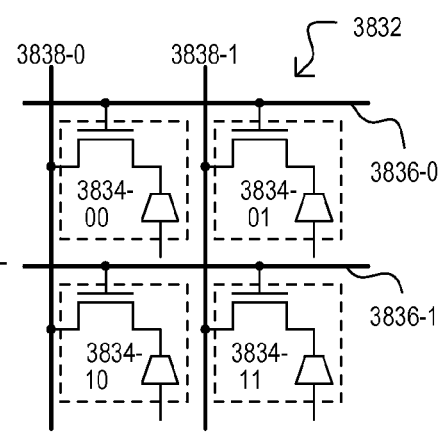
FIG. 37A  FIG. 37B  FIG. 38
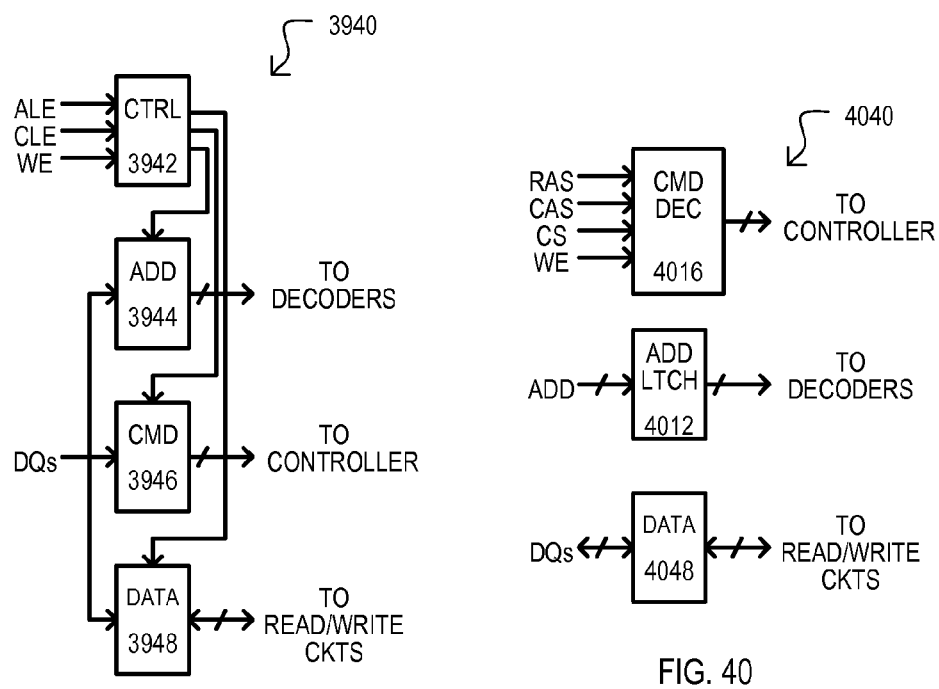
FIG. 39  FIG. 40

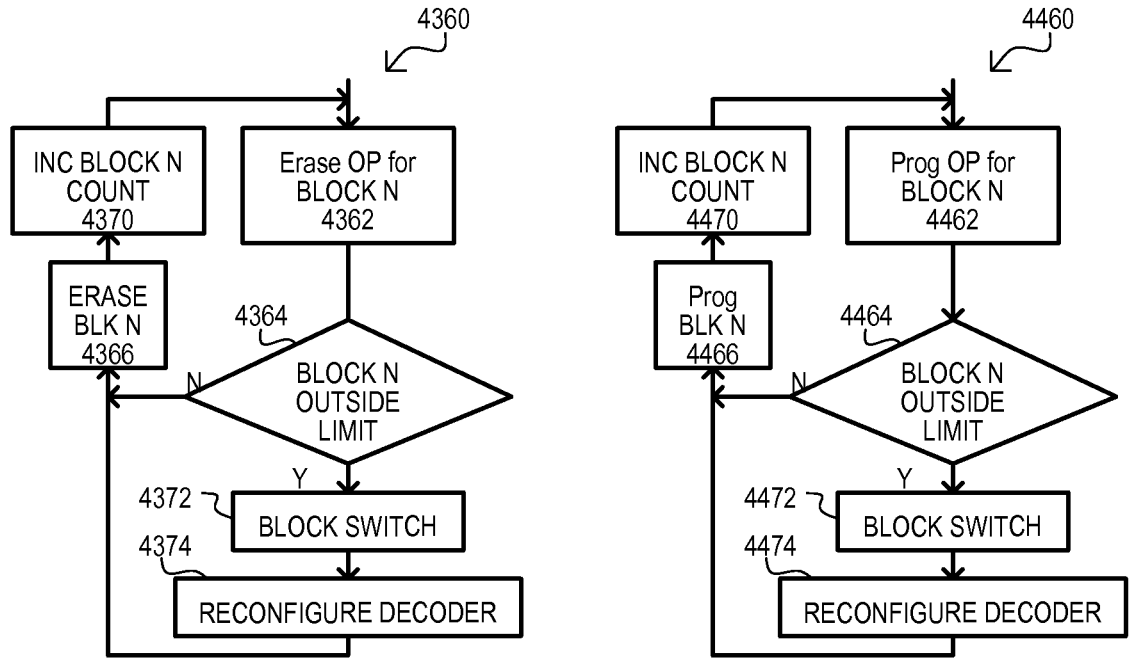
FIG. 43
FIG. 44
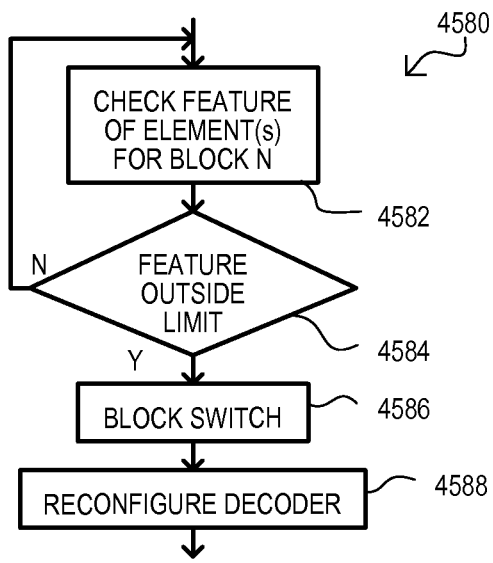
FIG. 45

CIRCUITS AND METHODS HAVING PROGRAMMABLE IMPEDANCE ELEMENTS

This application claims the benefit of U.S. Provisional Patent Application Ser. No. 61/347,749 filed on May 24, 2010, the contents of which are incorporated by reference herein.

TECHNICAL FIELD

The present disclosure relates generally to integrated circuits, and more particularly to integrated circuits having programmable impedance elements

BRIEF DESCRIPTION OF THE DRAWINGS

FIG. 5A to 5C are block schematic diagrams of a device according to a further embodiment having circuits configured by a latch circuit with two programmable impedance elements.

FIGS. 9A to 10 are block schematic diagrams of a device according to an embodiment having circuits configured by a latch circuit with one programmable impedance element and a fixed resistance element.

FIGS. 37A and 37B are block schematic diagrams of programmable decoders that can be included in embodiments.

FIG. 38 is a block schematic diagram of memory cell array that can be included in embodiments.

FIG. 39 is a block schematic diagram of a memory device interface that can be included in embodiments.

FIG. 40 is a block schematic diagram of another memory device interface that can be included in embodiments.

FIG. 43 is a flow diagram of a method according to an embodiment.

FIG. 44 is a flow diagram of a method according to another embodiment.

FIG. 45 is a flow diagram of a method according to a further embodiment.

DETAILED DESCRIPTION

Figure 1:
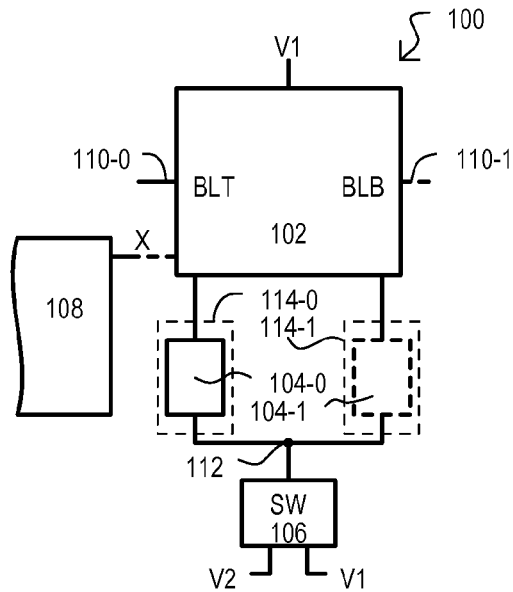
FIG. 1 is a block schematic diagram of a device according to one embodiment having circuits configured by a latch circuit having one or more programmable impedance elements.

Integrated circuit devices and methods are disclosed. An integrated circuit device may include any of: memory cells that establish configuration states for re-configurable circuits; memory circuits having programmable impedance elements formed at "crossbar" points of intersecting conductive lines; and/or a programmable decoder that alters a decoding operation in response to configuration information.

In particular embodiments, an integrated circuit (IC) device may include a plurality of memory cells that store configuration data, each memory cell including a latch circuit and at least one programmable resistance element; and a re-configurable circuit coupled to the memory cells having a function that varies in response to the configuration data.

In other embodiments, an IC device may include a plurality of first conductive lines, each connected to a control terminal of a different access transistor; a plurality of second conductive lines; and a plurality of programmable impedance elements, each element formed at a different intersection of a first conductive line and a second conductive line.

In further embodiments, an integrated circuit may be a memory device having a plurality of memory cells physically arranged into blocks and accessed by select signals, each memory cell having elements programmable to different impedances; and a programmable decoder that generates at least a portion of the select signals in response to received address values, the programmable decoder altering a decoder operation in response to configuration information.

In the various embodiments, like features may be referred to by the same reference character but with the first digit (s) corresponding to the figure number.

Referring now to FIG. 1, a device according to one embodiment is shown in a block schematic diagram and designated by the general reference character 100. A device 100 may include a latch circuit 102, one or more programmable resistance elements (hereinafter PR elements) (104-0/1), a write switch circuit 106, and a programmable circuit 108.

A latch circuit 102 may be a circuit switchable between two or more stable states. A latch circuit 102 may provide a stored data value "X" that varies according to its state. In the embodiment shown, a latch circuit 102 may be connected to a first power supply node V1, one or more bit lines (BLT and/or BLB), and one or more programmable resistance elements (104-0/1). In addition, in FIG. 1, a latch circuit 102 may be connected to a virtual supply node 112 by first and second latch paths 114-0 and 114-1.

A PR element (104-0/1) may be a structure programmable between at least two different resistance states. In particular embodiments, such programming may be substantially non-volatile, maintaining a resistance value in the absence of power. PR elements (104-0/1) may be programmed by applying predetermined voltages and/or currents to such elements. PR elements 104-0/1 may be any suitable programmable resistance structure that causes latch circuit 102 to enter one particular stable state in response to power being applied to the circuit. In one embodiment, PR elements 104-0/1 may include a solid-state ion conductor material. In a very particular embodiment, elements 104-0/1 may be programmable metallization cells (PMCs). Particular examples of PMCs are described in U.S. Pat. Nos. 6,635,914 and 7,359,236.

In one embodiment, PR elements (104-0 or 114-1) may be included in both latch paths 114-0 and 114-1. Alternatively, a single PR element 104 may be connected between latch circuit 102 and write switch circuit 106. That is, one of latch paths 114-0 or 114-1 may include a PR element 104-0/1, while the other latch path does not include such an element.

A write switch circuit 106 may connect a virtual supply node 112 to at least a second supply voltage (V2) or a write voltage, which in the particular embodiment of FIG. 1, may be a first power supply voltage (V1).

A programmable circuit 108 may provide circuit functions that vary in response to stored data value "X". Accordingly, when power is applied to latch circuit 102, it may output stored data value "X" based on a state of PR element(s) 104-0/1. Data value X may be a configuration value provided to programmable circuit 108 to thereby establish a particular function of such a circuit.

Write operations for the device of FIG. 1 according to particular embodiments will now be described with reference to FIGS. 2A and 2B.

Figure 2A:
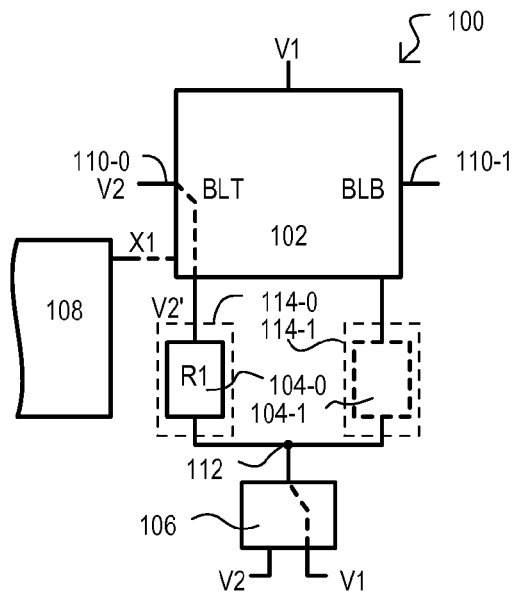
FIGS. 2A and 2B show write operations for the embodiment of FIG. 1

FIG. 2A shows the device of FIG. 1 being written to store a first value. Such a value results in latch circuit 102 outputting a stored data value X1. According to embodiments, a voltage difference may be created between a bit line (in this example bit line BLT) and virtual supply node 112 that causes a PR element 104-0 to be placed into a particular resistance state.

In the very particular example of FIG. 2A, a first bit line voltage V2 may be applied at one bit line (BLT). In addition, a write voltage V1 may be applied to virtual supply node 112 by operation of write switch circuit 106. It is understood that all or a portion of voltage (V2) applied at bit line 110-0 may be applied through latch circuit 102 to first terminal of PR element 104-0 as voltage V2'. Voltage V1 may be applied to a second terminal of PR element 104-0 from virtual supply node 112. Such a voltage difference across the terminals of PR element 104-0 (V2'-V1) may be sufficient to force PR element 104-0 to one resistance state (R1).

Figure 2B:
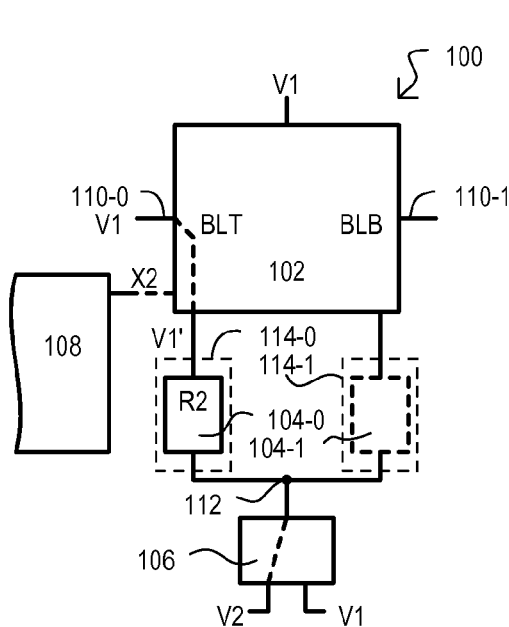

FIG. 2B shows the device of FIG. 1 being written to store a second value. Such a value results in latch circuit 102 outputting a stored data value X2.

In the very particular example of FIG. 2B, a second bit line voltage V1 may be applied at one bit line (BLT). In addition, another voltage V2 may be applied to virtual supply node 112 by operation of write switch circuit 106. It is understood that all or a portion of voltage (V1) applied at bit line 110-0 may be applied through latch circuit 102 to first terminal of PR element 104-0 as voltage V1'. Voltage V2 may be applied to a second terminal of PR element 104-0 from virtual supply node 112. Such a voltage difference across the terminals of PR element 104-0 (V1'-V2) may be sufficient to force PR element 104-0 to one resistance state (R2).

Resistance states (R2, R1) vary in such a way as to cause latch circuit 102 to maintain different data states.

Figure 3:
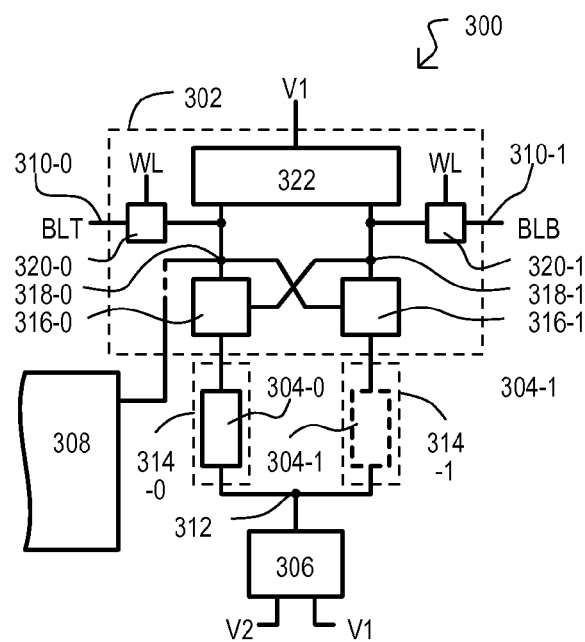
FIG. 3 is a block schematic diagram of a device according to another embodiment having circuits configured by a latch circuit having one or more programmable impedance elements.

Referring now to FIG. 3, shows a device 300 according to an embodiment is shown in a block schematic diagram. Device 300 may be one version of that shown in FIG. 1. FIG. 3 shows a device 300 in which a latch circuit 302 may include latching active devices 316-0/1, latch nodes 318-0/1, access device(s) 320-0/1, and load circuit 322.

Active devices 316-0/1 may provide controllable current paths in response to signals at control terminals. Active devices 316-0/1 may be connected to one another in a "cross-coupled" fashion to provide latching between two stable states. A first active device 316-0 may have a controllable impedance path connected between first latch node 318-0 and PR element 304-0, and a control terminal connected to second latch node 318-1. A second active device 316-1 may have a controllable impedance path connected between second latch node 318-1 and PR element 304-1, and a control terminal connected to first latch node 318-0. Active devices 316-0/1 may include transistors, or the like.

Latch nodes 318-0/1 may latch between opposing logic states according to values of PR elements 304-0/1. In one very particular embodiment, if a resistance of first PR element 304-0 is greater than that of second PR element 304-1, first latch node 318-0 may latch to a higher voltage (e.g., about V1) than second latch node 318-1, and vice versa. In FIG. 3, a stored data value may be output to a programmable circuit 308 from first latch node 318-0.

Access devices 320-0/1 may allow voltages to be applied by way of bit lines 310-0/1. While the embodiment shows a two bit lines and two access devices, other embodiments may include but one bit line and one access device. A first access device 320-0 may have a controllable impedance path connected between first bit line 310-0 and first latch node 318-0, and have control terminal connected to receive an access signal WL. A second access device 320-1 may have a controllable impedance path connected between second bit line 310-1 and second latch node 318-1, and have a control terminal connected to receive access signal WL. Access devices 320-0/1 may include transistors, or the like.

Figure 4A:
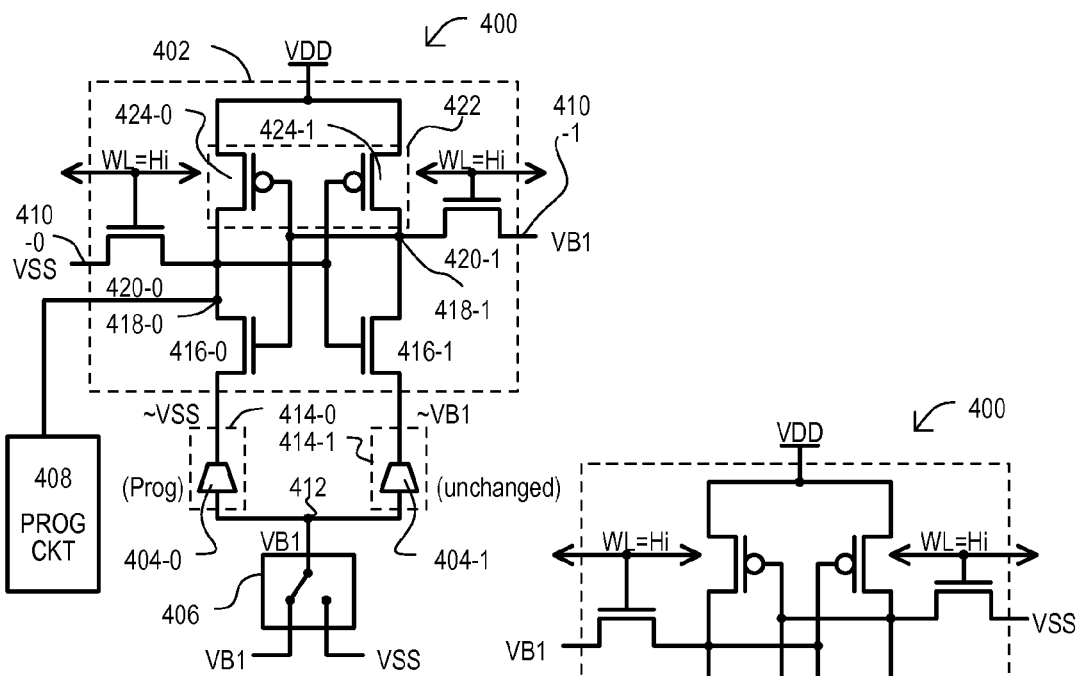
FIGS. 4A to 4C are block schematic diagrams of a device according to an embodiment having circuits configured by a latch circuit with two programmable impedance elements.
Figure 4B:
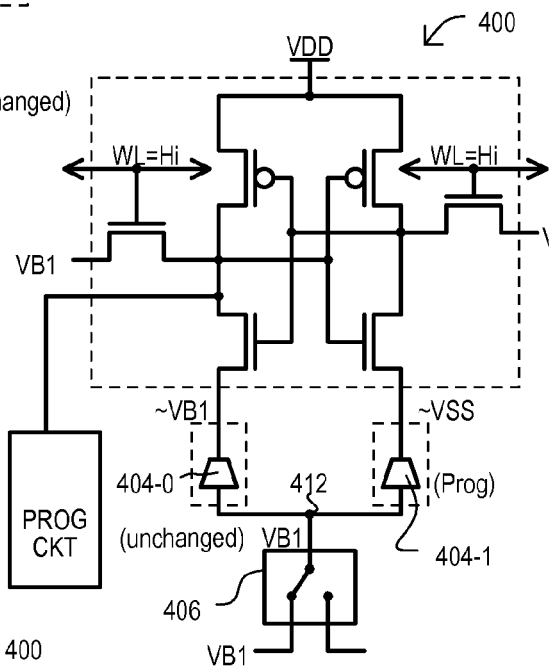
Figure 4C:
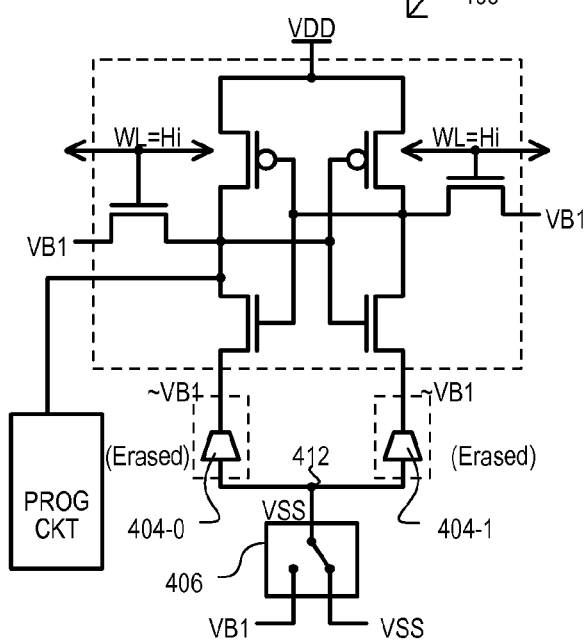

Referring now to FIGS. 4A to 4C, a device 400 according to another embodiment is shown in a sequence of block schematic diagrams. Device 400 may be one version of that shown in FIGS. 3 and/or 1.

Device 400 differs from that of FIG. 3 in that programmable resistance elements 404-0/1 are shown to be PMCs, having anodes connected to virtual supply node 412. A cathode of first PMC 404-0 may be connected to active device 416-0, and a cathode of second PMC 404-1 may be connected to active device 416-1. PMCs 404-0/1 may be programmed to opposite resistance states (e.g., relatively high and low) to store particular configuration value for programmable circuit 408. In the following description, write operations to PMCs may include program operations that give PMCs a relatively low resistance, and erase operations that give PMCs a relatively high resistance.

Device 400 also differs from that of FIG. 3 in that active devices 416-0/1 and access devices 420-0/1 may be n-channel insulated gate field effect (e.g., MOS) transistors (IGFETs). In addition, load circuit 422 may include p-channel IGFETs 424-0/1

FIG. 4A shows one example of the programming of PMC 404-0 to a low resistance state. In the particular embodiment shown, a first voltage (in this example VSS) may be applied to a first bit line 410-0, while a program voltage VB1 may be applied to second bit line 410-1. Write switch circuit 406 may apply program voltage VB1 to virtual supply node 412. It is assumed that program voltage VB1 is greater than VSS.

A voltage may be applied to gates of access devices 420-0/1 that enables all or a portion of voltage VB1 to be applied to second latch node 418-1 and all or a portion of voltage VSS to be applied to first latch node 418-0. The application of such voltages may result in active device 416-0 passing all or a portion of voltage VSS (shown as ~VSS) to a cathode of first PMC 404-0, and voltage VB1 to an anode of first PMC 404-0. It is assumed that VB1−(~VSS) is sufficient to program a PMC into a low resistance state. A second PMC 404-1 may remain substantially unchanged.

FIG. 4B shows one example of the programming of PMC 404-1 to a low resistance state. FIG. 4B shows the same device as FIG. 4A, so some reference characters are omitted to avoid cluttering the view.

The particular embodiment shown may be understood by the described operation for FIG. 4A, and differs in that bit line voltages are switched. In the arrangement shown, PMC 404-1 may be programmed to a relatively low resistance while PMC 404-0 may remain substantially unchanged.

FIG. 4C shows an example of the erasing of both PMCs 404-0 and 404-1 to a high resistance state. FIG. 4C shows the same device as FIG. 4A, so some reference characters are omitted to avoid cluttering the view.

In the particular embodiment shown, an erase voltage, which in this example happens to be VB1, may be applied to both first and second bit lines 410-0/1. Switch circuit 406 may apply a low power supply voltage VSS to virtual supply node 412.

A voltage may be applied to gates of access devices 420-0/1 that enables all or a portion of voltage VB1 to be applied to first and second latch nodes 418-0/1. The application of such voltages may result in active devices 416-0/1 passing all or a portion of voltage VB1 (shown as ~VB1) to cathodes of both first and second PMCs 404-0/1. It is assumed that VSS−(~VB1) is sufficient to erase a PMC to a high resistance state.

Accordingly, in one very particular embodiment, in a device 400, to write a "1" as a stored value, both PMCs may be erased to a high resistance state, as shown in FIG. 4C. A second PMC 404-1 may be programmed to a low resistance state as shown in FIG. 4B. Consequently, latch circuit 402 may latch first latch node 418-0 to a high voltage (i.e., VDD) and second latch node 418-1 to a low voltage (i.e., VSS).

Conversely, to write a "0" as a stored value, both PMCs may be erased to a high resistance state, as shown in FIG. 4C. A first PMC 404-0 may be programmed to a low resistance state as shown in FIG. 4A. Consequently, latch circuit 402 may latch second latch node 418-1 to the high voltage and first latch node 418-0 to the low voltage.

Referring now to FIGS. 5A to 5C, a device 500 according to another embodiment is shown in a sequence of block schematic diagrams. Device 500 may be one version of that shown in FIGS. 3 and/or 1.

FIGS. 5A to 5C show a device like that of FIGS. 4A to 4C, but with PMCs 504-0/1 having anodes connected to active devices 516-0/1, respectively, and cathodes commonly connected to virtual supply node 512. FIGS. 5B and 5C show the same device as 5A, thus some reference characters are omitted from such drawings to avoid cluttering the view.

FIG. 5A shows one example of the erasing of PMC 504-0 to a relatively high resistance state, while PMC 504-1 remains substantially unchanged.

FIG. 5B shows one example of the erasing of PMC 504-1 to a relatively high resistance state, while PMC 504-0 remains substantially unchanged.

FIG. 5C shows the programming of both PMCs 504-0/1 to a relatively low resistance state.

Such programming and erase operations are understood with reference to the description of FIGS. 4A to 4C.

Accordingly, in one very particular embodiment, in device 500, to write a "1" as a stored value, both PMCs may be programmed to a low resistance state, as shown in FIG. 5C. A first PMC 504-0 may be erased to a high resistance state as shown in FIG. 5A. Consequently, latch circuit 502 may latch first latch node 518-0 to a high voltage (i.e., VDD) and second latch node 518-1 to a low voltage (i.e., VSS).

Conversely, to write a "0" as a stored value, both PMCs may be programmed to a low resistance state, as shown in FIG. 5C. A second PMC 504-1 may be erased to a high resistance state as shown in FIG. 5B. Consequently, latch circuit 502 may latch second latch node 518-1 to the high voltage and first latch node 518-0 to the low voltage.

Figure 6A:
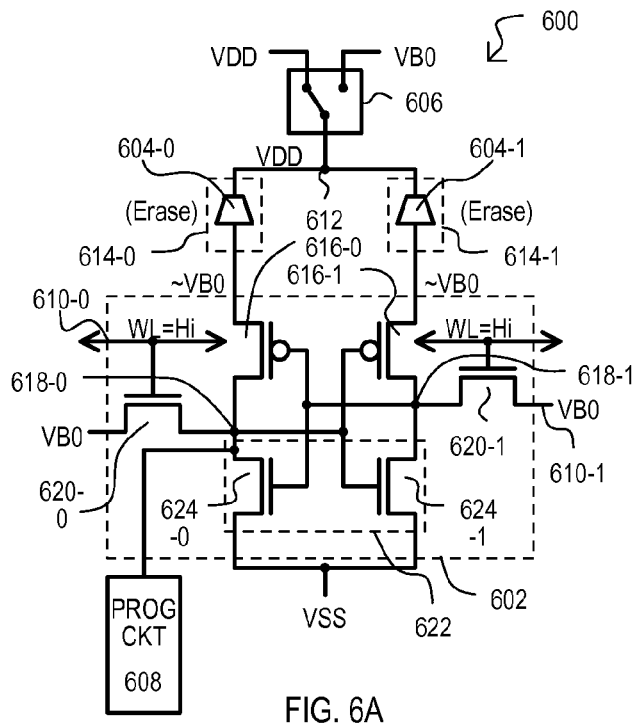
FIGS. 6A to 6C are block schematic diagrams of a device according to another embodiment having circuits configured by a latch circuit with two programmable impedance elements.
Figure 6B:
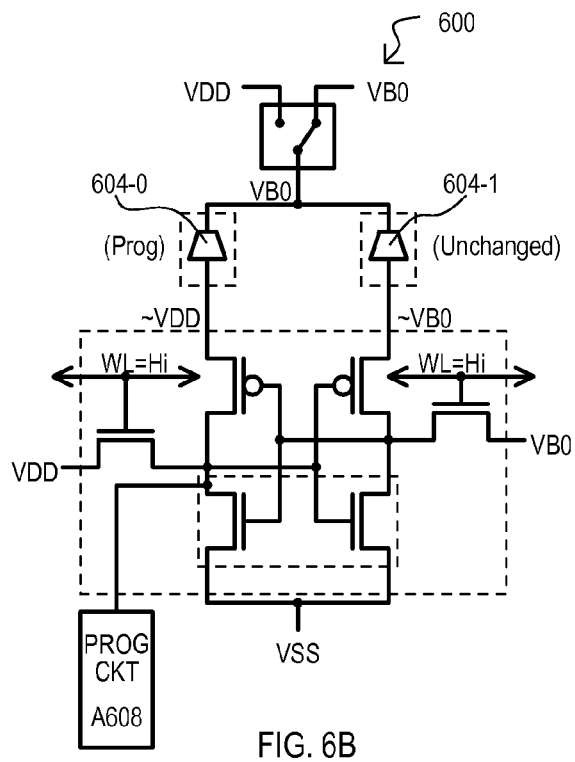
Figure 6C:
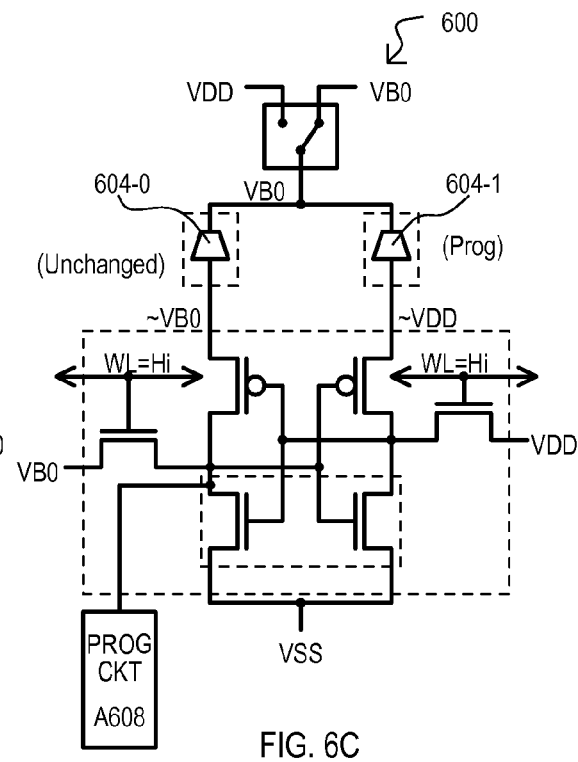

Referring now to FIGS. 6A to 6C, a device 600 according to a further embodiment is shown in a sequence of block schematic diagrams. Device 600 may be one version of that shown in FIGS. 3 and/or 1.

FIGS. 6A to 6C show a device like that of FIGS. 4A to 4C, but with n-channel load circuit 622 coupled to a low power supply node VSS, and active devices 616-0/1 being p-channel devices. Further, PMCs 604-0/1 may be connected between active devices 616-0/1 and write switch circuit 606. In particular, PMCs 604-0/1 may have anodes connected to active devices 616-0/1 and cathodes commonly connected to virtual supply node 612. Write switch circuit 606 may switch between a high power supply voltage VDD and a write voltage VB0. FIGS. 6B and 6C show the same device as 6A, thus reference characters are omitted from such drawings.

FIG. 6A shows one example of the erasing of both PMCs 604-0/1 to a relatively high resistance state.

FIG. 6B shows one example of the programming of PMC 604-0 to a relatively low resistance state, while PMC 604-1 remains substantially unchanged.

FIG. 6C shows one example of the programming of PMC 604-1 to a relatively low resistance state, while PMC 604-0 remains substantially unchanged.

Such programming and erase operations are understood with reference to the description of FIGS. 4A to 4C.

Accordingly, in one very particular embodiment, in device 600, to write a "1" as a stored value, both PMCs may be erased to a high resistance state, as shown in FIG. 6A. A first PMC 604-0 may be programmed to a low resistance state as shown in FIG. 6B. Consequently, latch circuit 602 may latch first latch node 618-0 to a high voltage (i.e., VDD) and second latch node 618-1 to a low voltage (i.e., VSS).

Conversely, to write a "0" as a stored value, both PMCs may be erased to a high resistance state, as shown in FIG. 6A. A second PMC 604-1 may be programmed to a low resistance state as shown in FIG. 6C. Consequently, latch circuit 602 may latch second latch node 618-1 to the high voltage and first latch node 618-0 to the low voltage.

Figure 7A:
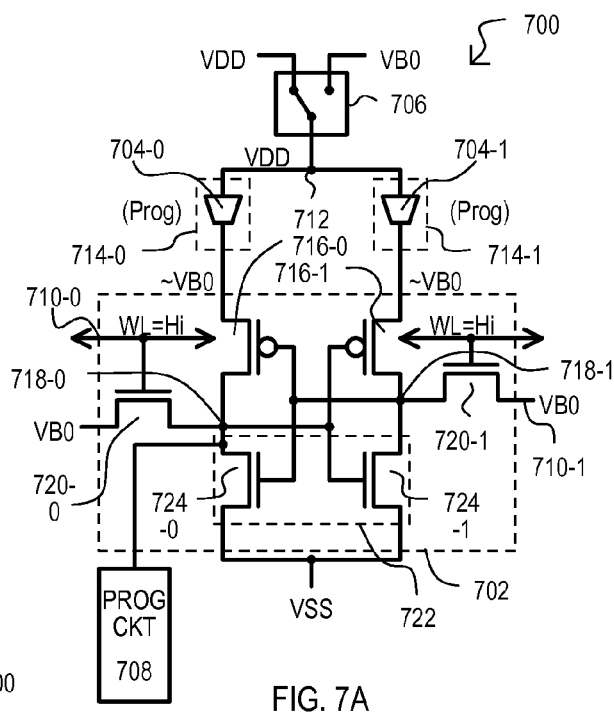
FIGS. 7A to 7C are block schematic diagrams of a device according to another embodiment having circuits configured by a latch circuit with two programmable impedance elements.
Figure 7B:
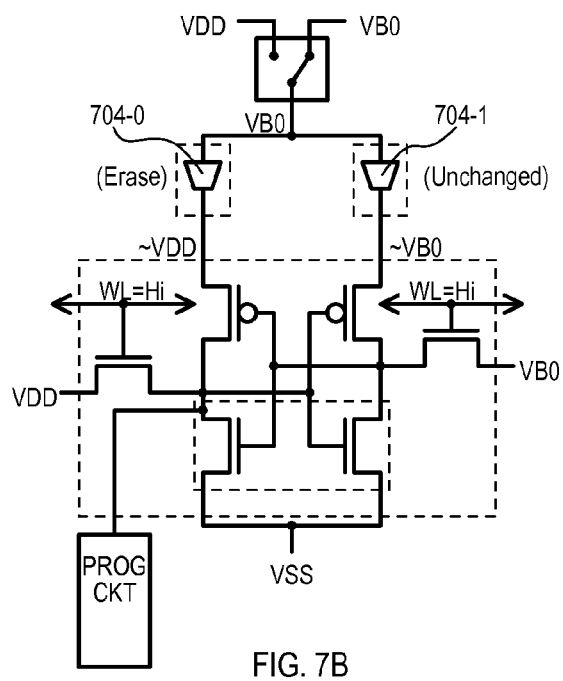
Figure 7C:
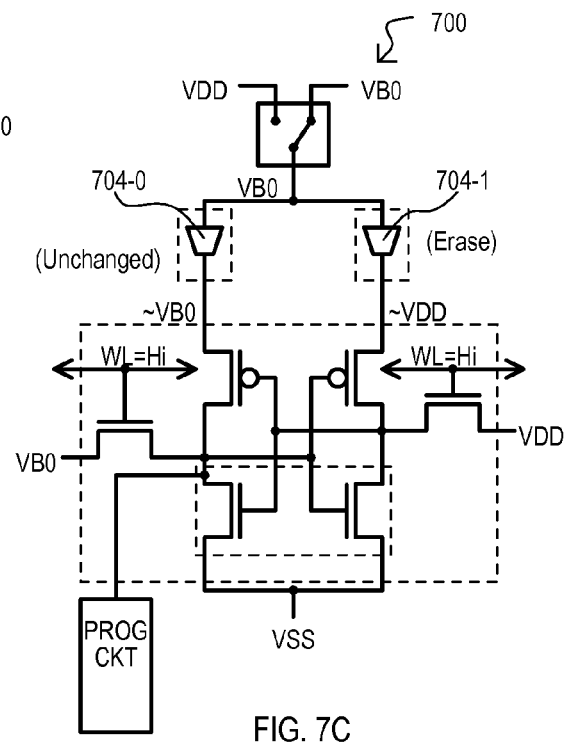

Referring now to FIGS. 7A to 7C, a device 700 according to a further embodiment is shown in a sequence of block schematic diagrams. Device 700 may be one version of that shown in FIGS. 3 and/or 1.

FIGS. 7A to 7C show a device like that of FIGS. 6A to 6C, but with PMCs 704-0/1 having cathodes connected to active devices 716-0/1, respectively, and anode commonly connected to virtual supply node 712. FIGS. 7B and 7C show the same device as 7A, thus some reference characters are omitted from such drawings to avoid cluttering the view.

FIG. 7A shows one example of the programming of PMCs 704-0/1 to a relatively low resistance state.

FIG. 7B shows one example of the erasing of PMC 704-0 to a relatively high resistance state, while PMC 704-1 remains substantially unchanged.

FIG. 7C shows one example of the erasing of PMC 704-1 to a relatively high resistance state, while PMC 704-0 remains substantially unchanged.

Such programming and erase operations are understood with reference to the description of FIGS. 4A to 4C.

Accordingly, in one very particular embodiment, in device 700, to write a "1" as a stored value, both PMCs may be programmed to a low resistance state, as shown in FIG. 7A. A second PMC 704-1 may be erased to a high resistance state as shown in FIG. 7C. Consequently, latch circuit 702 may latch first latch node 718-0 to a high voltage (i.e., VDD) and second latch node 718-1 to a low voltage (i.e., VSS).

Conversely, to write a "0" as a stored value, both PMCs may be programmed to a low resistance state, as shown in FIG. 7A. A first PMC 704-0 may be erased to a high resistance state as shown in FIG. 7B. Consequently, latch circuit 702 may latch second latch node 718-1 to the high voltage and first latch node 718-0 to the low voltage.

Figure 8A:
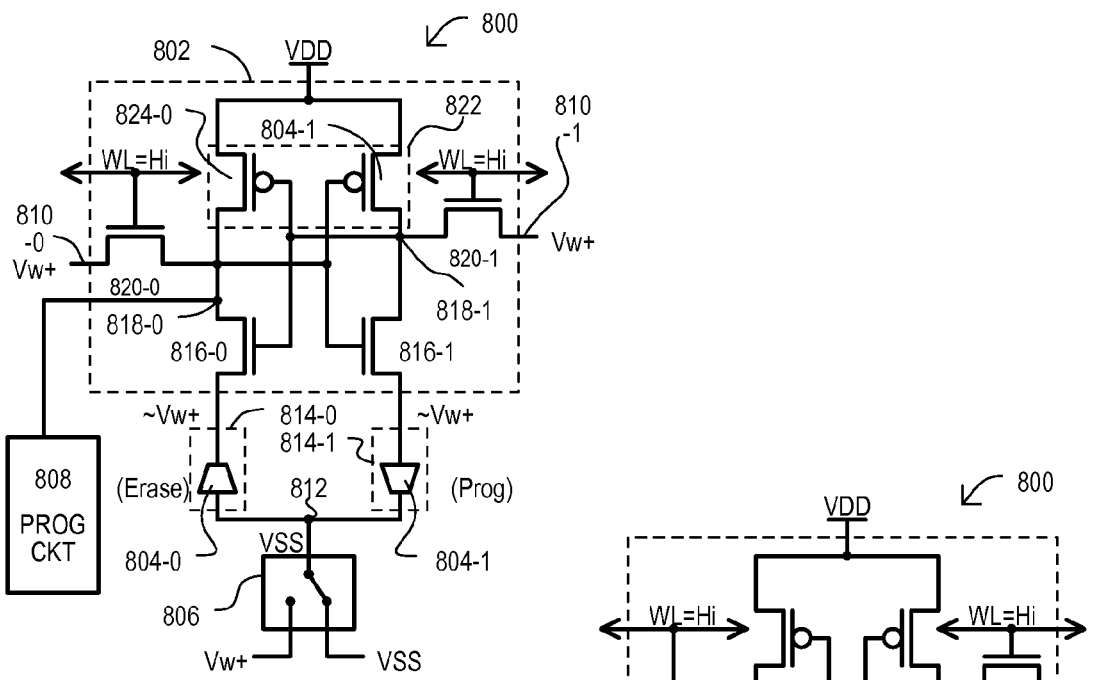
FIGS. 8A to 8C are block schematic diagrams of a device according to an embodiment having circuits configured by a latch circuit with two programmable impedance elements having opposite terminal connections.
Figure 8B:
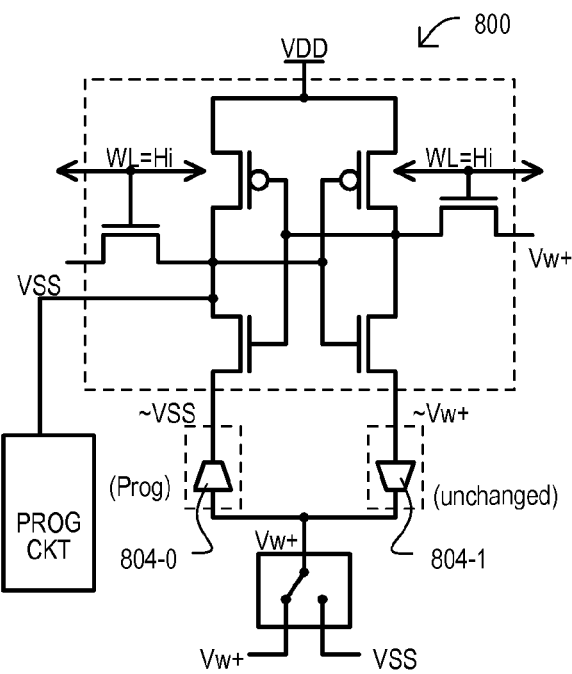
Figure 8C:
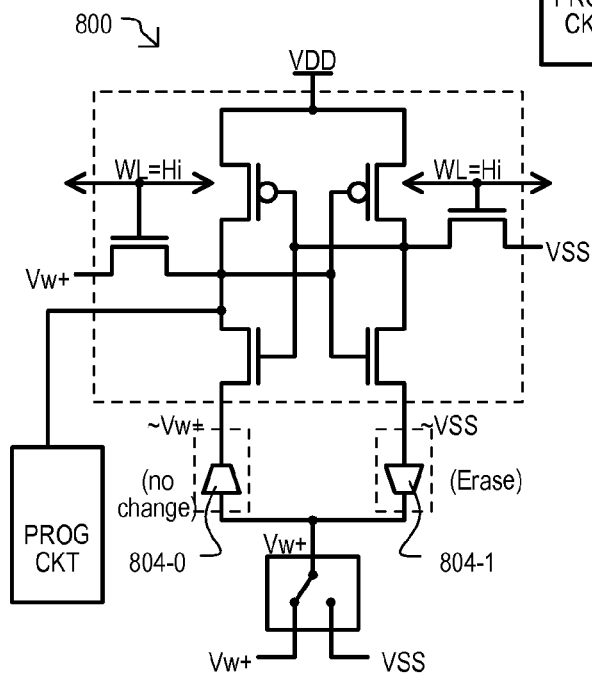

Referring now to FIGS. 8A to 8C, a device 800 according to another embodiment is shown in a sequence of block schematic diagrams. Device 800 may be one version of that shown in FIGS. 3 and/or 1.

FIGS. 8A to 8C show a device like that of FIGS. 4A to 4C, but with PMC 804-0/1 terminals connected in an opposing fashion. In particular, PMC 804-0 may have a cathode connected to active devices 816-0 and an anode connected to virtual supply node 812, while PMC 804-1 may have an anode connected to active devices 816-1 and a cathode connected to virtual supply node 812. FIGS. 8B and 8C show the same device as 8A, thus some reference characters are omitted from such drawings to avoid cluttering the view.

FIG. 8A shows one example of the erasing of PMC 804-0 to a relatively high resistance state, and the programming of PMC 804-1 to a relatively low resistance state.

FIG. 8B shows one example of the programming of PMC 804-0 to a relatively low resistance state, while PMC 804-1 remains substantially unchanged.

FIG. 8C shows one example of the erasing of PMC 804-1 to a relatively high resistance state, while PMC 804-0 remains substantially unchanged.

Such programming and erase operations are understood with reference to the description of FIGS. 4A to 4C.

Accordingly, in one very particular embodiment, in device 800, to write a "1" as a stored value, PMC 804-0 may be erased and PMC 804-1 may be programmed as shown in FIG. 8A. Consequently, latch circuit 802 may latch first latch node 818-0 to a high voltage (i.e., VDD) and second latch node 818-1 to a low voltage (i.e., VSS).

Conversely, to write a "0" as a stored value, PMC 804-0 may be programmed to a relatively low resistance state, as shown in FIG. 8B. In addition, second PMC 804-1 may be erased to a high resistance state as shown in FIG. 8C. Consequently, latch circuit 802 may latch second latch node 818-1 to the high voltage and first latch node 818-0 to the low voltage.

FIGS. 8A to 8C show but one embodiment. Other embodiments may include PMCs connected in an opposite fashion to that shown in FIGS. 8A to 8C. Similarly, PMCs may have connections like that shown in FIGS. 8A to 8C, but with an architecture like that shown in FIGS. 6A to 7C.

Referring now to FIGS. 9A and 9B, a device 900 according to another embodiment is shown in a sequence of block schematic diagrams. Device 900 may be one version of that shown in FIGS. 3 and/or 1.

FIGS. 9A and 9B show a device like that of FIGS. 4A to 4C, but differs in that it includes one PMC 904 and a static resistance element 926. In particular, PMC 904 may have a cathode connected to active device 916-0 and an anode connected to virtual supply node 912, while static resistance element 926 may be connected between active device 916-1 and virtual supply node 912.

FIG. 9A shows one example of the programming of PMC 904 to a relatively low resistance state. It is understood that in a programmed state, a PMC 904 may have a lower resistance than static resistance element 926.

FIG. 9B shows one example of the erasing of PMC 904 to a relatively high resistance state. It is understood that in an erased state, a PMC 904 may have a greater resistance than static resistance element 926.

Such programming and erase operations are understood with reference to the description of FIGS. 4A to 4C.

Accordingly, in one very particular embodiment, in device 900, to write a "1" as a stored value, PMC 904 may be erased as shown in FIG. 9A. In such a state, a first latch path 914-0 may have a higher resistance than a second latch path 914-1. Consequently, latch circuit 902 may latch first latch node 918-0 to a high voltage (i.e., VDD) and second latch node 918-1 to a low voltage (i.e., VSS).

Conversely, to write a "0" as a stored value, PMC 904 may be programmed. Accordingly, a first latch path 914-0 may have a lower resistance than a second latch path 914-1. Consequently, latch circuit 902 may latch first latch node 918-0 to a low voltage (i.e., VSS) and second latch node 918-1 to a high voltage (i.e., VDD).

Referring now to FIG. 10 a device 1000 according to another embodiment is shown in block schematic diagram. Device 1000 may be one version of that shown in FIGS. 3 and/or 1.

FIG. 10 shows a device like that of FIGS. 9A and 9B, but may include two virtual supply nodes. In particular, a PMC 1004 may be connected between active device 1016-0 and a first virtual supply node 1012-0, while static resistance element 1026 may be connected between active device 1016-1 and a second virtual supply node 1012-1. First virtual supply node 1012-0 may be driven between a power supply voltage VSS and a write voltage VB1 by a first write switch circuit 1006-0. Similarly, second virtual supply node 1012-1 may be driven between a power supply voltage VSS and a write voltage VB1 by a second write switch circuit 1006-1.

In one embodiment, a PMC 1004 may be programmed in a manner like that shown in FIG. 9A, by first write switch circuit 1006-0 driving first virtual supply node 1012-0 to write voltage VB1, while second write switch circuit 1006-1 may drive second virtual supply node 1012-1 to a write voltage VB1.

A PMC 1004 may be erased in matter like that shown in FIG. 9B by first write switch circuit 1006-0 driving first virtual supply node 1012-0 to a low supply voltage VSS, while second write switch circuit 1006-1 may drive second virtual supply node 1012-1 to a write voltage VB1. Such an arrangement may result in less current flowing through static resistance element 1026 than is the case for FIG. 9B.

It is understood that FIGS. 9A, 9B and 10 show but one embodiment. Other embodiments may include a PMC and static resistance element connected in opposite latch paths to those shown. Similarly, a PMC and static resistance element may have an opposite connection like that shown in FIGS. 9A and/or 10, but with architecture like that shown in FIGS. 6A to 7C.

Figure 11A:
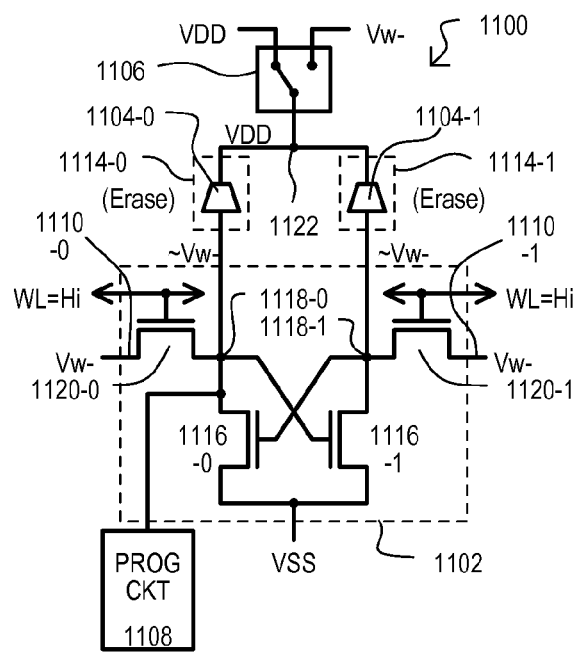
FIGS. 11A to 11C are block schematic diagrams of a device according to one embodiment having circuits configured by a latch circuit having two programmable impedance elements.
Figure 11B:
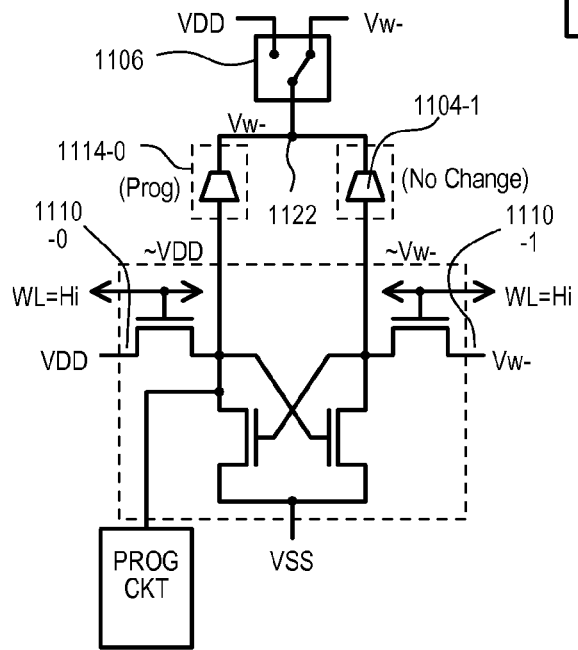
Figure 11C:
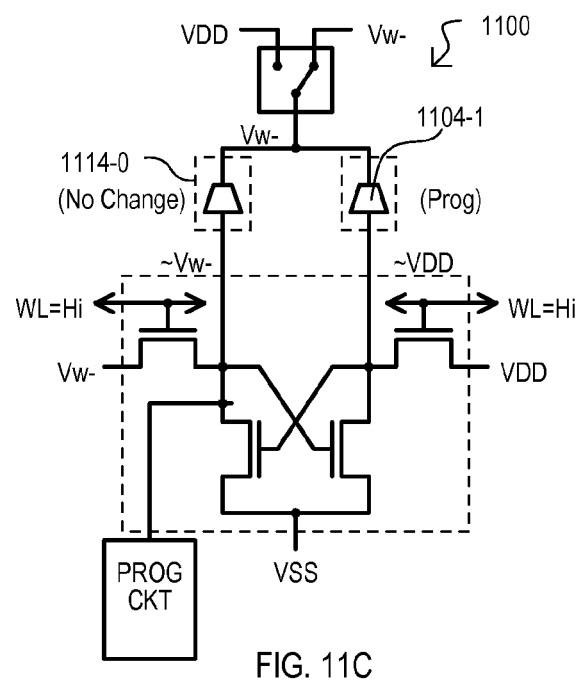

Referring now to FIGS. 11A to 11C, a device according to an embodiment is shown in a sequence of block schematic diagram.

FIGS. 11A to 11C show a device 1100 in which a latch circuit 1102 may include latching active devices 1116-0/1, latch nodes 1118-0/1, access device(s) 1120-0/1, and virtual supply node 1122. In the embodiment shown, active devices 1116-0/1 may be n-channel IGFETs connected to one another in a "cross-coupled" fashion to provide latching between two stable states. Access devices 1120-0/1 may allow voltages to be applied by way of bit lines 1110-0/1, and may also be n-channel IGFETs. While the embodiment shows two bit lines and two access devices, other embodiments may include but one bit line and one access device.

FIGS. 11B and 11C show the same device as FIG. 11A, thus some reference characters are omitted from such drawings to avoid cluttering the view.

FIG. 11A shows one example of the erasing of both PMCs 1104-0/1 to low resistance states. In the particular embodiment shown, a low write voltage (Vw−) may be applied to both bit lines 1110-0/1. Write switch circuit 1106 may apply a high voltage VDD to virtual supply node 111-222. It is assumed that program voltage Vw− is less than VDD.

A voltage may be applied to gates of access devices 1120-0/1 that enables all or a portion of voltage Vw− to be applied to latch nodes 1118-0/1. The application of such voltages may result in latch nodes 1118-0/1 applying voltage Vw− to anodes of PMCs 1104-0/1. It is assumed that (Vw−)−VDD is sufficient to erase a PMC into a low resistance state. Consequently, PMCs 1104-0/1 may both be erased.

FIG. 11B shows one example of the programming of PMC 1104-0 to a low resistance state. A high supply voltage (VDD) may be applied to bit line 1110-0, while a low write voltage (Vw−) may be applied to bit line 1110-1. Write switch circuit 1106 may apply low write voltage (Vw−) to virtual supply node 1122. When access devices 1112-0/1 are enabled, PMC 1104-0 may be programmed to a relatively low resistance state, while PMC 1104-1 may remain substantially unchanged.

FIG. 11C shows one example of the programming of PMC 1104-1 to a low resistance state. The particular embodiment shown may follow the operation shown in FIG. 11B, however, bit line voltages are switched. In the arrangement shown, PMC 1104-1 may be programmed to a relatively low resistance while PMC 1104-0 may remain substantially unchanged.

Accordingly, in one very particular embodiment, in a device 1100, to write a "1" as a stored value, both PMCs may be erased to a low resistance state, as shown in FIG. 11A. A first PMC 1104-0 may be programmed to a low resistance state as shown in FIG. 11B. Consequently, latch circuit 1102 may latch first latch node 1118-0 to a high voltage (i.e., VDD) and second latch node 1118-1 to a low voltage (i.e., VSS).

Conversely, to write a "0" as a stored value, both PMCs may be erased to a low resistance state, as shown in FIG. 11A. A second PMC 1104-1 may be programmed to a low resistance state as shown in FIG. 11C. Consequently, latch circuit 1102 may latch second latch node 1118-0 to the high voltage and first latch node 1118-0 to the low voltage.

Figure 12:
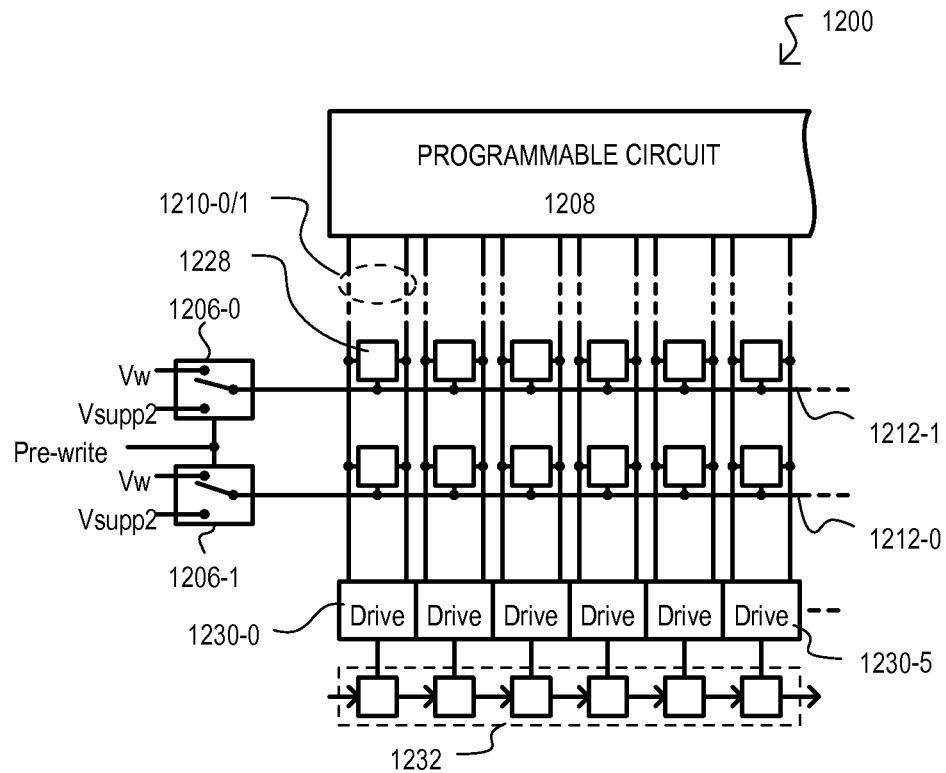
FIG. 12 is a block schematic diagram of a device according to one embodiment having circuits configured by latch elements programmed with write circuits according to data from a data input circuit.

Referring to FIG. 12, a device according to an embodiment is shown in block schematic diagram and designated by the general reference character 1200. A device 1200 may include a number of memory cells (one shown as 1228), write switch circuits (e.g., 1206-0/1), a programmable circuit 1208, write circuits (two shown as 1230-0 and 1230-5), and write data input circuit 1232.

Memory cells (e.g., 1228) may each include latch circuits and one or more programmable resistance elements, as shown in embodiments herein and equivalents. Memory cells may be arranged into groups that are commonly connected to write switch circuits 1206-0/1. Similarly, groups of memory cells 1228 may be commonly connected to bit line pairs (one pair shown as 1210-0/1). In the very particular embodiment shown, memory cells of a same row may be connected to a same write switch circuit 1206-0/1 by a corresponding virtual supply node 1212-0/1, while memory cells of a same column may be connected to a same bit line pair.

Write switch circuits 1206-0/1 may drive virtual supply nodes 1212-0/1 between various voltages suitable to set resistances of programmable resistance elements of memory cells (e.g., 1228) according to embodiments shown herein and equivalents.

A programmable circuit 1208 may provide functions based on configuration data values stored in memory cells (e.g., 1228). While a programmable circuit 1208 may take various forms, particular examples of programmable circuits will be shown in more detail below.

Write circuits (e.g., 1230-0,-5) may drive corresponding bit line pairs (e.g., 1206-0/1) in response to write data values. Bit line pairs may be driven to potentials suitable to set resistance values of programmable resistance elements. In particular embodiments, bit line pairs may both be driven to a same value, or to different values.

Write data input circuit 1232 may receive write data from an external location, and provide such write data to write circuits 1230-0 to -5. In the very particular embodiment shown, a write data input circuit 1232 may include registers arranged in a serial fashion that allow a serial stream of configuration data to be shifted into a device 1200, and then provided to write circuits 1230-0 to -5.

Figure 13:
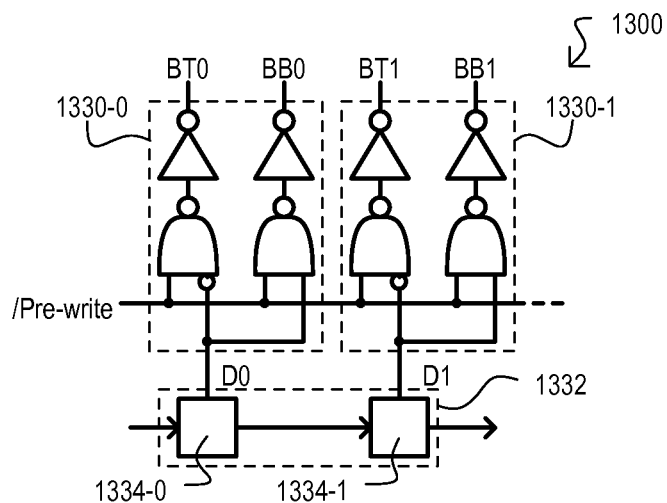
FIG. 13 is a block schematic diagram of write circuits and data input circuits that can be included in embodiments.

FIG. 13 shows one example of write circuits 1330-0/1 and a write data input circuit 1332 that can be included in an embodiment like that of FIG. 12.

In response to a signal "/Pre-write" being active (low in this example), write circuits may drive bit line pairs to a same voltage (in this example, low). In response to a signal /Pre-write being inactive (high in this example), write circuits may drive bit line pairs to complementary values according to received write data values (e.g., D0, D1).

A write data input circuit 1332 may be a serial shift register that includes registers 1334-0/1 for storing configuration data, and providing such data to write circuits 1330-0/1

Figure 14:
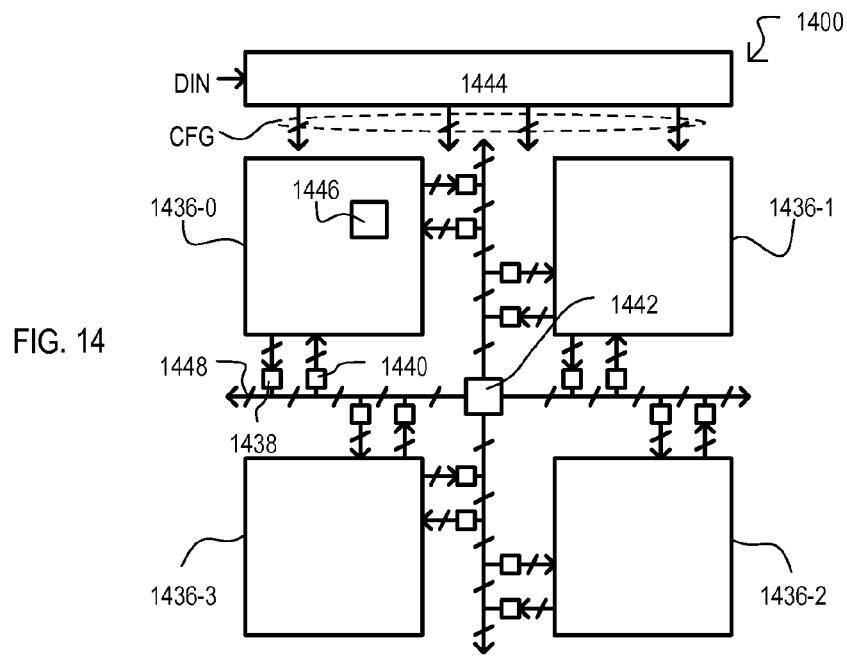
FIG. 14 is a block schematic diagram of a programmable logic device according to an embodiment.

Referring now to FIG. 14, a programmable logic device 1400 according to an embodiment is shown in a block schematic diagram. A programmable logic device 1400 that may include programmable blocks 1436-0 to -3, block output de-multiplexers (DeMUXs) (one shown as 1438), block input multiplexers (MUXs) (one shown as 1440), a path switch circuit 1442, and a resistive memory configuration data store 1444.

A resistive memory configuration data store 1444 may store configuration data for establishing functions of various other features of device 1400. A resistive memory configuration data store 1444 may store received configuration data DIN in a substantially nonvolatile fashion, and may include any of the memory circuits and devices shown herein, and equivalents. Such configuration data may be output to the various other portions of the programmable logic device 1400 to thereby establish the functions of such portions.

Programmable blocks 1436-0 to -3 may each include a number of programmable logic sections (one shown as 1446). Each programmable logic section 1446 may provide a predetermined logic operation based on configuration data received from data store 1444.

Block DeMUXs (e.g., 1438) may selectively connect outputs from programmable blocks (1436-0 to -3) to a data lane (one shown as 1448) based on configuration data. Similarly, block MUXs (e.g., 1440) may selectively connect a data lane (e.g., 1448) to inputs of programmable blocks (1436-0 to -3) based on configuration data.

A path switch circuit 1442 may selectively connect lines of data lanes (e.g., 1448) to one another based on configuration data.

Figure 15:
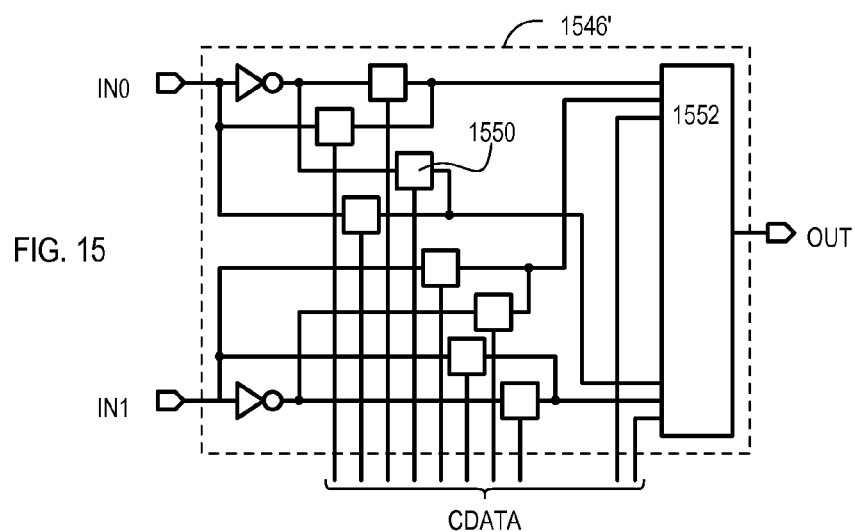
FIG. 15 is a block schematic diagram of a programmable logic section that can be included in embodiments.

FIG. 15 shows one example of a programmable logic section 1546' that may be included in embodiments. Programmable logic section 1546' may provide a predetermined logic operation on inputs IN0 and IN1 to generate an output value OUT.

In the particular example shown, programmable logic section 1546' may include passgates (one shown as 1550), as well as logic circuits 1552. Passgates (e.g., 1550) may selectively connect an input value (IN0, IN1), or its inverse, to logic circuits according to configuration data CDATA. Logic circuits 1552 may logically combine received input values (or inverses thereof) along with configuration data, to generate an output value OUT.

Configuration data may be provided by memory circuits shown herein, and equivalents.

Figure 16:
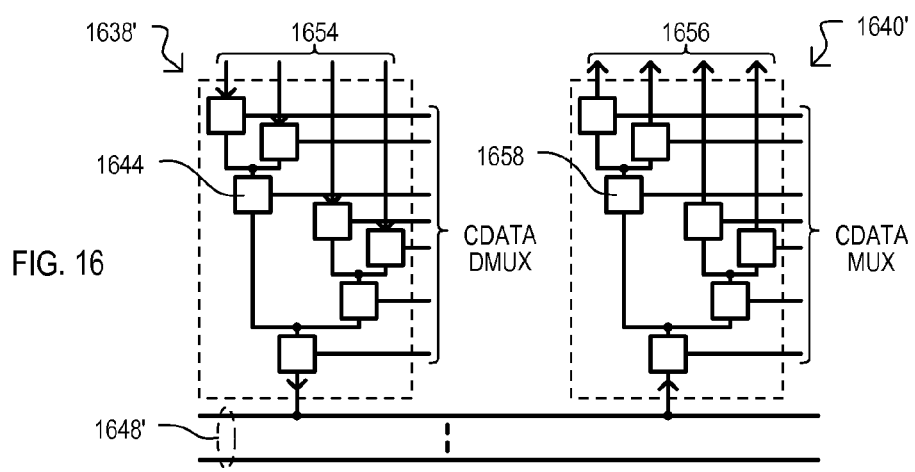
FIG. 16 is a block schematic diagram of an output de-multiplexer and input multiplexer that can be included in embodiments.

FIG. 16 shows one example of a block output DeMUX 1638' and a block input MUX 1640' that may be included in embodiments.

A block output DeMUX 1638' may selectively connect block outputs 1654 from a circuit section to a conductive line within a data lane 1648'. A block output DeMUX 1638' may include a number of DeMUX gates (one shown as 1644), each of which may provide a conductive connection according to configuration data CDATA DMUX.

A block input MUX 1640' may selectively connect a conductive line of a data lane 1648' to any of multiple block inputs 1656. A block input MUX 1640' may include a number of MUX gates (one shown as 1658), each of which may provide a conductive connection according to configuration data CDATA MUX.

Configuration data (CDATA DMUX, CDATA MUX) may be provided by memory circuits shown herein, and equivalents.

Figure 17:
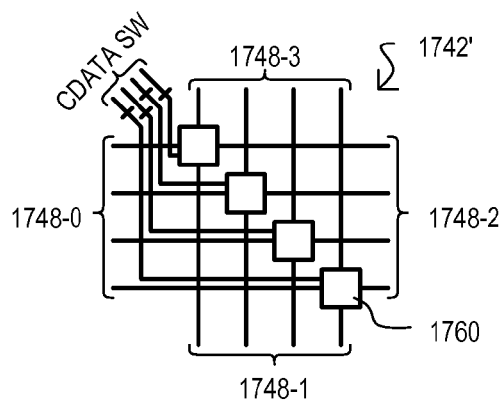
FIG. 17 is a block schematic diagram of a path switch circuit that can be included in embodiments.

FIG. 17 shows one example of a path switch circuit 1742' that may be included in embodiments. A path switch circuit 1742' may selectively connect conductive lines of one or two data lanes (in this example, four data lanes 1748-0 to -3) to one another.

In the particular example shown, path switch circuit 1742' may include crosspoint circuits (one shown as 1760) formed at intersections of one conductive line from each data lane (1748-0 to -3). Each cross point circuit (e.g., 1760) may selectively connect lines to one another based on configuration data CDATA SW.

Configuration data (CDATA SW) may be provided by memory circuits shown herein, and equivalents.

Figure 18:
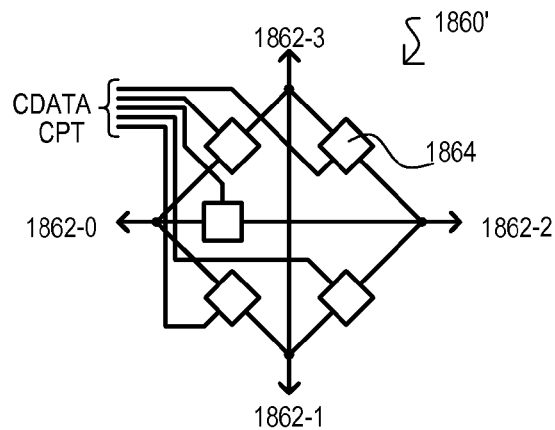
FIG. 18 is a block schematic diagram of a crosspoint circuit that can be included in embodiments.

FIG. 18 shows one example of a crosspoint circuit 1860' that may be included in embodiments. A crosspoint circuit 1860' may be formed at intersections of conductive lines (in this example, four lines 1862-0 to -3). In the example shown, crosspoint circuit 1860' may include crosspoint gates (one shown as 1864) that may each provide a conductive path according to configuration data CDATA CPT.

Configuration data (CDATA CPT) may be provided by memory circuits shown herein, and equivalents.

Figure 19:
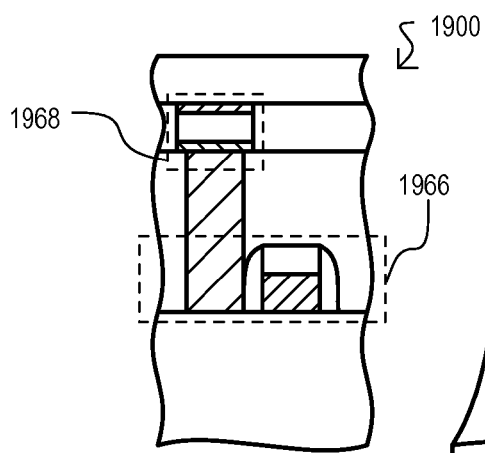
FIG. 19 is a side cross sectional view of a device according to an embodiment.

FIG. 19 shows one example of a device 1900 in a side cross sectional view. A device 1900 may include a transistor layer 1966 and a resistive element layer 1968. A transistor layer 1966 may include transistors for circuits, such as latch circuits as shown above in various embodiments. A resistive element layer 1968 may be formed on a different level than transistor layer 1966, and may include programmable resistance elements (such as PMCs), as shown in embodiments above.

As shown, nonvolatile storage elements (i.e., programmable resistance elements) may be formed on a different layer than transistor elements. This is in contrast to approaches that may store nonvolatile configuration data in an entirely separate device.

Figure 20:
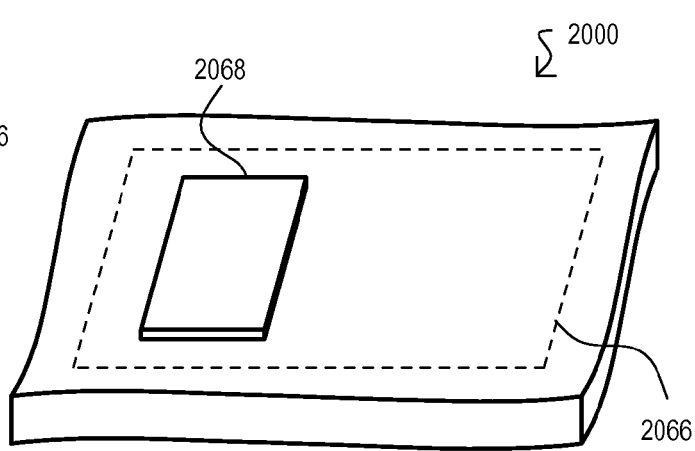
FIG. 20 is a perspective view of an integrated circuit device according to an embodiment.

Referring now to FIG. 20, one example of an integrated circuit device 2000 according to an embodiment is shown in a perspective view. An integrated circuit device 2000 may include a transistor layer 2066 formed in a substrate 2070, and a resistive element layer 2068 formed over a transistor layer 2066.

Configuration data may be written into a storage circuits that include transistors formed in transistor layer 2066, as well as programmable resistance elements formed in resistive element layer 2068. Such configuration data may then establish a function of one or more configurable circuits formed all or in part within transistor layer 2066.

Figure 21:
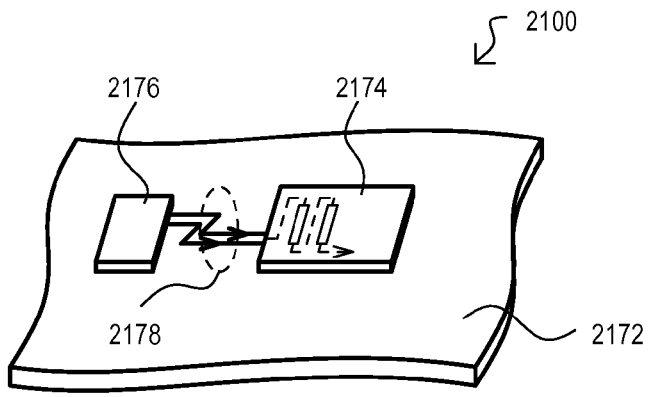
FIG. 21 is a perspective view of a conventional programmable logic assembly.

Referring now to FIG. 21, a conventional programmable logic assembly 2100 is shown for comparison with that shown in FIG. 20. Assembly 2100 may include a circuit board 2172, a field programmable gate array (FPGA) integrated circuit (IC) 2174, and a "flash" electrically erasable and programmable read only memory (EEPROM) IC 2176.

Configuration data may be stored in a nonvolatile fashion within flash EEPROM IC 2176. Such configuration data may be loaded from flash EEPROM IC 2176 into nonvolatile storage locations of FPGA IC 2174 via a serial data path 2178.

The arrangement of FIG. 21 is in contrast to that of FIG. 20, in which two different integrated circuits may be utilized, one for nonvolatile storage, and one for programmable logic. In contrast, the embodiment of FIG. 20 may be a single IC, with nonvolatile storage of configuration data being provided by a resistive element layer.

Further, in embodiments described above, nonvolatile configuration data stored by states of resistive elements may be loaded substantially instantaneously, as latches may power-up (or be reset into) states established by such programmable resistance elements. This is in sharp contrast to the arrangement of FIG. 21, in which data may be loaded into volatile latched of FPGA IC 2174 by a serial data stream in order to re-initiate the FPGA IC 2174 into its desired programmed state.

Figure 22A:
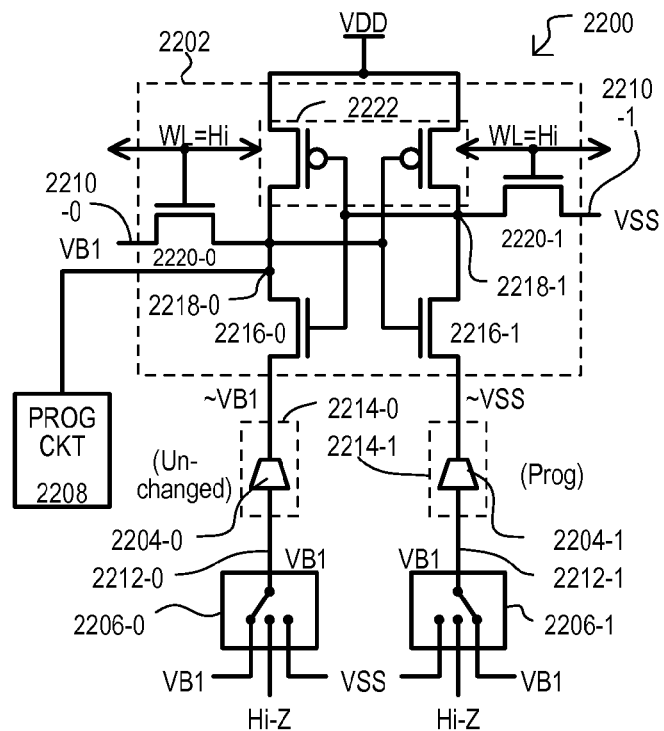
FIGS. 22A and 22B are block schematic diagrams of a device according to an embodiment having circuits configured by a latch circuit with two programmable impedance elements.
Figure 22B:
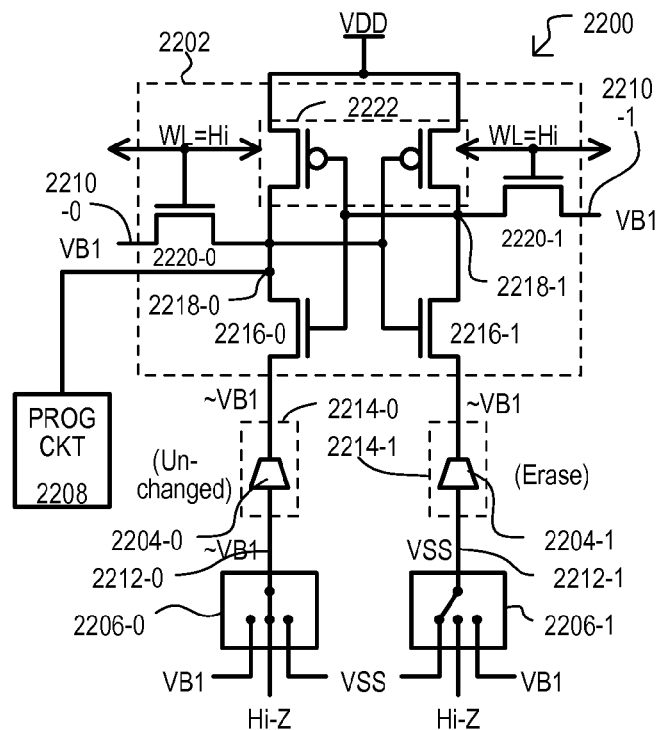

Referring now to FIGS. 22A and 22B, a device according to another embodiment is shown in a block schematic diagram, and designated by the general reference character 2200.

FIGS. 22A and 22B show a device like that of FIGS. 4A to 4C, but may include two virtual supply nodes. In particular, a PMC 2204-0 may be connected between active device 2216-0 and a first virtual supply node 2212-0, while second PMC 2204-1 may be connected between active device 2216-1 and a second virtual supply node 2212-1. First virtual supply node 2212-0 may be driven between a power supply voltage VSS, a write voltage VB1, and a high impedance state (Hi-Z) by a first write switch circuit 2206-0. Similarly, second virtual supply node 2212-1 may be driven between a power supply voltage VSS, a write voltage VB1, and a high impedance state (Hi-Z) by a second write switch circuit 2206-1.

FIG. 22A shows one example of the programming of PMC 2204-1 to a low resistance state. In the particular embodiment shown, a first voltage (in this example VSS or close to VSS) may be applied to a second bit line 2210-1, while a program voltage VB1 may be applied to first bit line 2210-0. Write switch circuit 2206-0 may apply program voltage VB1 to virtual supply node 2212-0, and write switch circuit 2206-1 may apply program voltage VB1 to virtual supply node 2212-1. It is assumed that program voltage VB1 is greater than VSS.

A voltage may be applied to gates of access devices 2220-0/1 that enables all or a portion of voltage VB1 to be applied to first latch node 2218-0 and all or a portion of voltage VSS to be applied to second latch node 2218-1. The application of such voltages may result in active device 2216-1 passing all or a portion of voltage VSS (shown as ~VSS) to a cathode of second PMC 2204-1. It is assumed that VB1–(~VSS) is sufficient to program second PMC 2204-1 into a low resistance state. A first PMC 2204-0 may remain substantially unchanged.

FIG. 22B shows one example of the erasing of PMC 2204-1 to a high resistance state. In the particular embodiment shown, an erase voltage, which in this example happens to be VB1, may be applied to both first and second bit lines 2210-0/1. Second circuit 2206-1 may apply a low power supply voltage VSS to second virtual supply node 2212-1, while first switch circuit 2206-0 may place first virtual supply node 2212-0 into a high impedance state. That is, first PMC 2204-0 may "float" in the erase operation of second PMC 2204-1.

A voltage may be applied to gates of access devices 2220-0/1 that enables all or a portion of voltage VB1 to be applied to first and second latch nodes 2218-0/1. The application of such voltages may result in active device 2216-0/1 passing all or a portion of voltage VB1 (shown as ~VB1) to cathodes of both first and second PMCs 2204-0/1. It is assumed that VSS–(~VB1) is sufficient to erase a second PMC 2204-1 to a high resistance state. However, because first PMC 2204-0 is floating, it may remain substantially unchanged.

It is understood that while FIGS. 22A and 22B show the programming and erasing of second PMC 2204-1, first PMC 2204-0 may be programmed and erased in the same manner.

Accordingly, in one very particular embodiment, in a device 2200, to write a "1" as a stored value, a second PMC 2204-1 may be programmed to a low resistance state as shown in FIG. 22A. In addition, a first PMC 2204-0 may be erased to a high impedance state, as understood from FIG. 22B (e.g., with second PMC 2204-1 floating). Consequently, latch circuit 2202 may latch first latch node 2218-0 to a high voltage (i.e., VDD) and second latch node 2218-1 to a low voltage (i.e., VSS).

Conversely, to write a "0" as a stored value, a first PMC 2204-0 may be programmed to a low resistance state as understood from FIG. 22A (e.g., first bit line 2210-0 receiving VSS, second bit line 2210-1 receiving VB1). In addition, second PMC 2204-1 may be erased as shown in FIG. 22B. Consequently, latch circuit 2202 may latch second latch node 2218-1 to the high voltage and first latch node 2218-0 to the low voltage.

Figure 23:
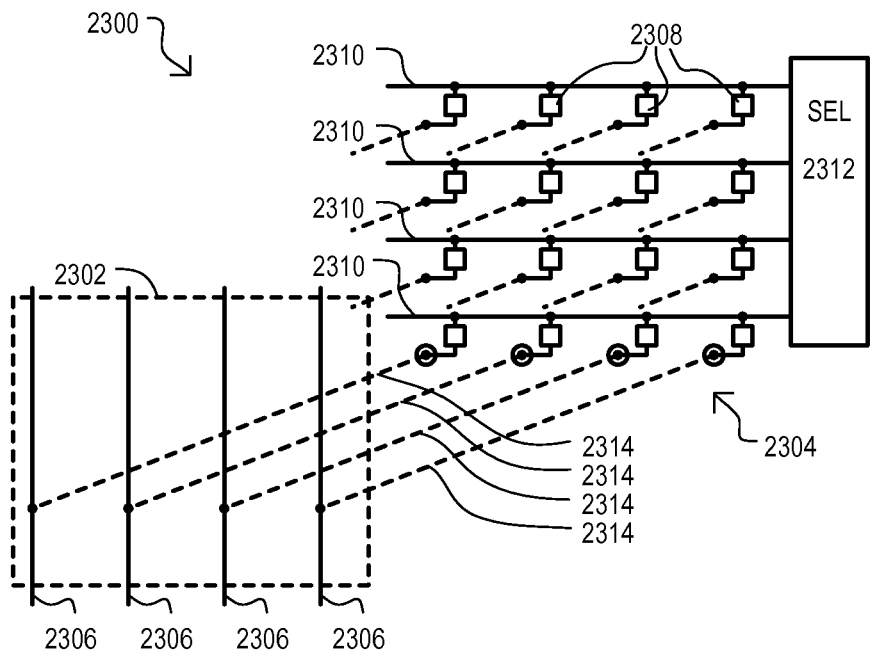
FIG. 23 is a diagram showing a memory device according to an embodiment.

FIG. 23 shows a memory device 2300 according to an embodiment. Memory device 2300 may include a transistor layer 2302, a programmable impedance element layer 2304, and a select voltage circuit 2312. Transistor and element layers (2302 and 2304) may be considered different layers as they may extend generally parallel to one another in one direction, and be conductively connected to one another in another direction. FIG. 23 shows four of sixteen conductive connections between layers as dashed lines 2314. In one embodiment, an element layer 2304 may be formed horizontally over or under transistor layer 2302, and be connected to transistor layer 2302 by vertical connections.

FIG. 23 shows layers 2302 and 2304 offset from one another to clearly show features of each layer. Such layers may be directly over one another so that connections 2314 are formed at crossings of lines 2306 and 2310.

In one embodiment, transistor layer 2302 may be formed in a semiconductor substrate and include a number of transistors. However, in alternate embodiments, a transistor layer 2302 may be formed all, or in part, by thin film transistors formed over a substrate. In FIG. 23, transistor layer 2302 may include word lines 2306 arranged in one direction (vertical in the view shown). Each word line 2306 may be connected to control one or more transistors (not shown) formed in transistor layer 2302. In a very particular example, word lines 2306 may each be conductively connected to, or be integrally formed with, one or more gates of insulated gate field effect transistors (e.g., MOS transistors). Word lines 2306 may enable (e.g., place into a relatively low impedance state) transistors in transistor layer 2302 to thereby allow a resistance of elements within element layer 2304 to be determined.

Element layer 2304 may include a number of programmable impedance elements (a few shown as 2308), each connected to a select line 2310. Select lines 2310 may be arranged in a direction different from that of word lines (horizontal in the view shown). In this way, elements 2308 may be formed at cross points of select lines 2310 and word lines 2306. Elements 2308 may be programmed between different impedance states by application of voltages between word lines 2306 and select lines 2310. In one embodiment, elements 2308 may include a solid-state ion conductor material. In a very particular embodiment, elements 2308 may be programmable metallization cells (PMCs). Particular examples of PMCs cells are shown and described in U.S. Pat. Nos. 6,635,914 and 7,359,236.

As understood from FIG. 23, word lines 2306 can span multiple programmable elements 2308 and select lines 2310.

A select voltage circuit 2312 may provide a voltage to select lines 2310. Such a voltage may be applied, via one or more corresponding elements 2308, to a corresponding word line 2306. According a programmed impedance of the corresponding element(s) 2308, a word line 2306 may enable, or not enable, transistors within transistor layer 2302, to thereby allow a state of the corresponding element 2308 to be determined (e.g., a data value to be read).

Figure 24A:
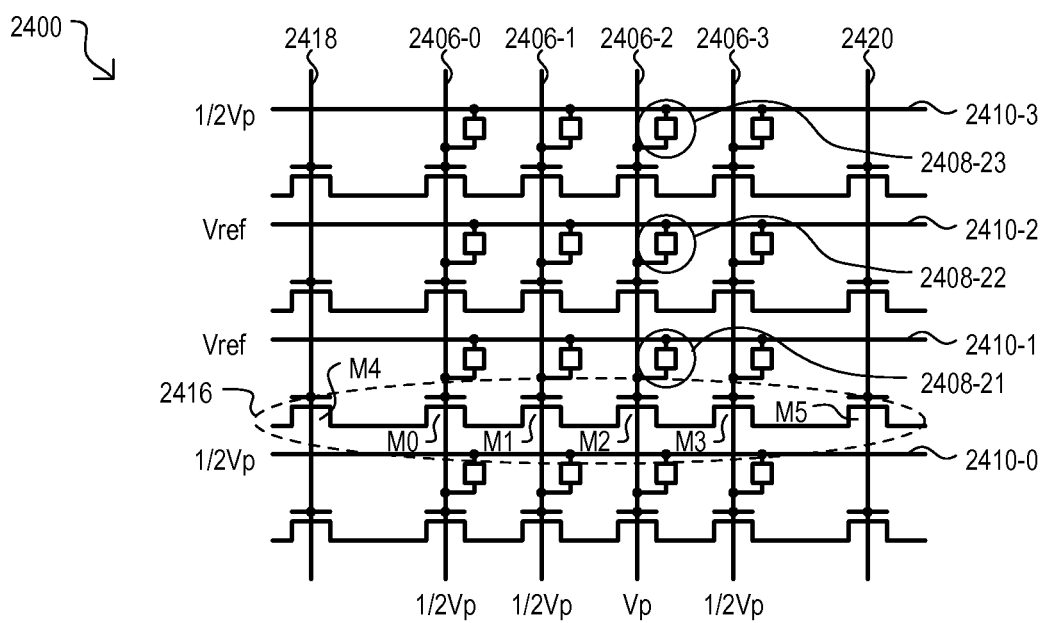
FIGS. 24A to 24C are schematic diagrams showing a memory device according to an embodiment having grouped access devices.
Figure 24B:
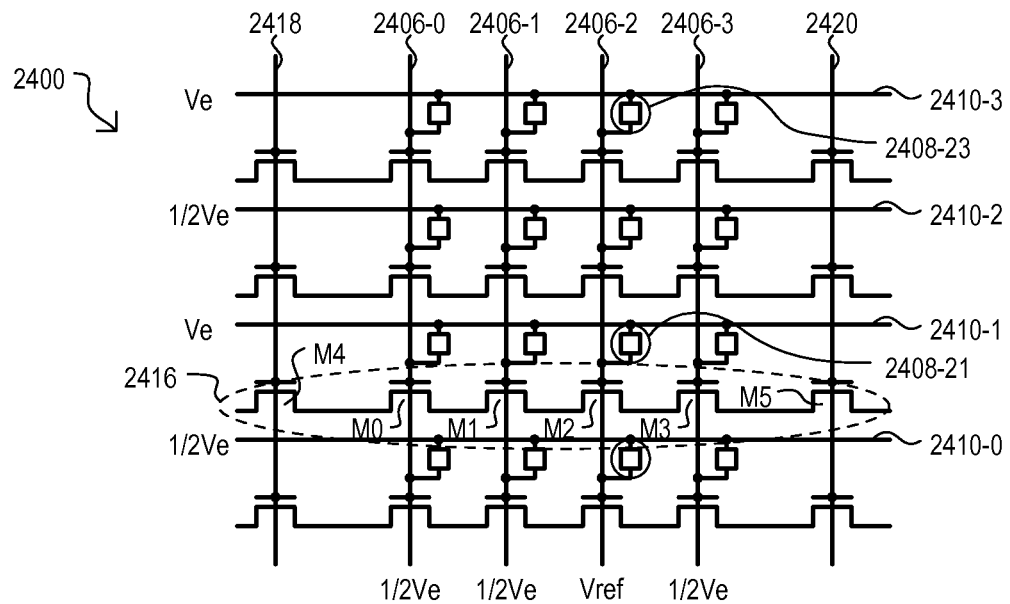
Figure 24C:
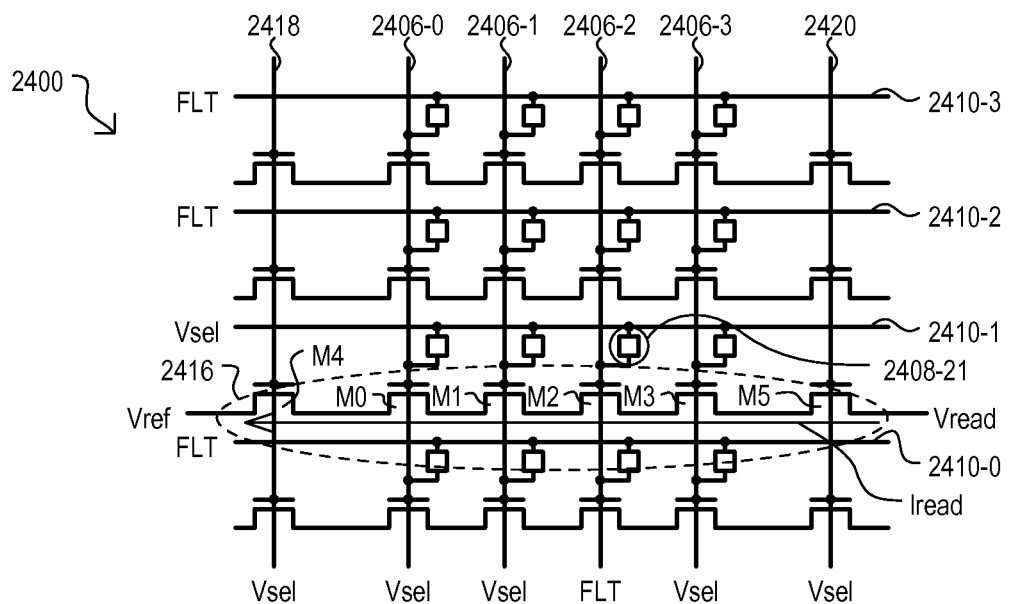

Referring now to FIGS. 24A to 24C, a memory device 2400 according to one embodiment is shown in a sequence of schematic diagrams that show various operations for the memory device. Memory device 2400 may include an element layer, like that shown as 2304 in FIG. 23. In FIGS. 24A to 24C, an element layer may include programmable impedance elements (three identified as 2408-21/22/23) connected to select lines 2410-1-3.

Memory device 2400 may also include a transistor layer 2402 having word lines 2406-0 to -3 with conductive connections to transistors as well as elements (e.g., 2408-21/22/23). In the example shown, transistors may include n-channel MOS type transistors, but other embodiments may include different types of transistors. Transistors are understood to have a control terminal (e.g., gate, base) that may control an impedance of a current path (e.g., source-drain path, collector-emitter path).

In FIGS. 24A to 24C, transistors may be arranged into groups, one shown as 2416. Each group 2416 may include series connected access transistors M0 to M3, a select transistor M4, and optionally, a second select transistor M5. Access transistors (e.g., M0 to M3) may each be connected to a word line 2406-0-3. A select transistor (e.g., M4) may be connected to a first group select line 2418, and second select transistors (e.g., M5) may be connected to a second group select line 2420. Elements (e.g., 2408-21/22/23) may be formed at intersections of word lines 2406-0-3 and select lines 2410-0-3 to form a cross point type array.

FIG. 24A shows one example of a program operation for memory device 2400. In FIG. 24A it is assumed that a voltage difference Vp-Vref is sufficient to program an element into at least a first state (e.g., low impedance), while a voltage difference Vp-½Vp is not sufficient to program an element. One or more of elements may be programmed by application of such voltages. In the example shown, multiple programmable elements of a same word line may be programmed at a same time. FIG. 24A shows two elements 208-22 and 208-21 being programmed. Word lines 2406-0,1,3 are driven to ½Vp, while word line 2406-2 (the word line connected to the programmed elements) is driven to Vp. At the same time, select lines 2410-0,3 are driven to ½Vp, while select lines 2410-1,2 (the select lines connected to the elements being programmed) may be driven to a reference voltage Vref.

FIG. 24B shows one example of an erase operation for memory device 2400. In FIG. 24B it is assumed that a voltage difference Vref-Ve is sufficient to erase an element into at least a second state (e.g., high impedance), while a voltage difference ½Ve-Ve is not sufficient to erase an element. One or more of elements may be erased by application of such voltages. In the example shown, multiple programmable elements of a same word line may be erased at a same time. FIG. 24B shows two elements 208-23 and 208-21 being erased. Word lines 2406-0,1,3 are driven to ½Ve, while word line 2406-2 (the word line connected to the elements being erased) is driven to Vref. At the same time, select lines 2410-0,2 are driven to ½Ve, while select lines 2410-1,3 (the select lines connected to the elements being erased) may be driven to an erase voltage Ve.

FIG. 24C shows one example of a read operation for memory device 2400. In a read operation, a select voltage on a select line may be applied through an element (the selected element) to a word line. Thus, a source-drain path of an access transistor connected to the word line may have an impedance that varies according the state of the selected element.

In FIG. 24C, data is read from programmable element 2408-21 within transistor group 2416. First and second group select lines 2418 and 2420 may be driven to a select voltage Vsel. A select voltage Vsel may be sufficient to enable transistors M4 and M5, thus enable a read voltage (Vread-Vref) to be applied across access transistors M0-M3. Word lines 2406-0,1,3 may be driven to select voltage Vsel, and thus transistors M0, M1 and M3 may be enabled. Unlike word lines 2406-0,1,3, word line 2406-2 (the word line connected to the element being read), is not driven to Vsel, but is allowed to float with respect to word line driving. In such an arrangement, a voltage on selected word line 2406-2 may be dependent upon a state of selected element 2408-21.

Un-selected select lines 2410-0,2,3 may be floated (e.g., isolated from any driving voltage). Accordingly, such un-selected select lines 2410-0,2,3 will not drive word lines through a selected element. In contrast, selected select line 2410-1 may be driven to a select voltage Vsel. Accordingly, a select voltage may be applied to word line 2406-2 through selected element 2408-21.

If selected element 2408-21 has a relatively low impedance, a large amount of voltage Vsel on select line 2410-0 may be applied to transistor M3, resulting in a relatively large read current Iread. In contrast, if a selected element 2408-21 has a relatively high impedance, less of voltage Vsel on select line 2410-0 may be applied to transistor M3, resulting in a relatively small, or essentially no read current (Iread).

While FIGS. 24A to 24C show transistor groups (e.g., 2416) with four access transistors, other embodiments may include fewer or larger numbers of transistors in series.

Referring now to FIGS. 25A to 25D, a memory device 2500 according to another embodiment is shown in a sequence of schematic diagrams that show various operations for the memory device.

Memory device 2500 may include an element layer, like that described for FIG. 24A, including programmable impedance elements (one shown as 2508-11) connected between select lines 2510-0-2 and word lines 2506-0-3.

Memory device 2500 may differ from that of FIG. 24A in that a transistor layer may include transistors each directly connected to a bit line 2522-0-2 and a source line 2524-0-3.

Figure 25A:
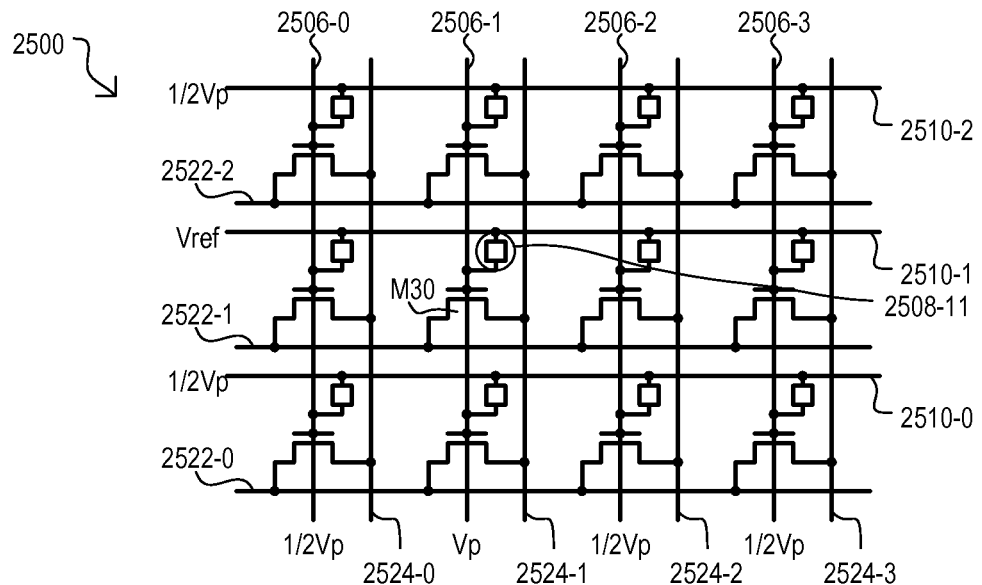
FIGS. 25A to 25D are schematic diagrams showing a memory device according to an embodiment having separately enabled access devices.

Thus, unlike FIG. 24A, in FIG. 25A other access transistors of a group do not have to be enabled to determine a state of an element that is to be read.

FIG. 25A shows one example of a program operation for memory device 2500. A program operation may occur in a manner like that shown for FIG. 24A, with a sufficient programming voltage being applied between appropriate word lines 2506-0-2 and select lines 2510-0-2 to change a state of an element. FIG. 25A particularly shows the programming of an element 2508-11.

Figure 25B:
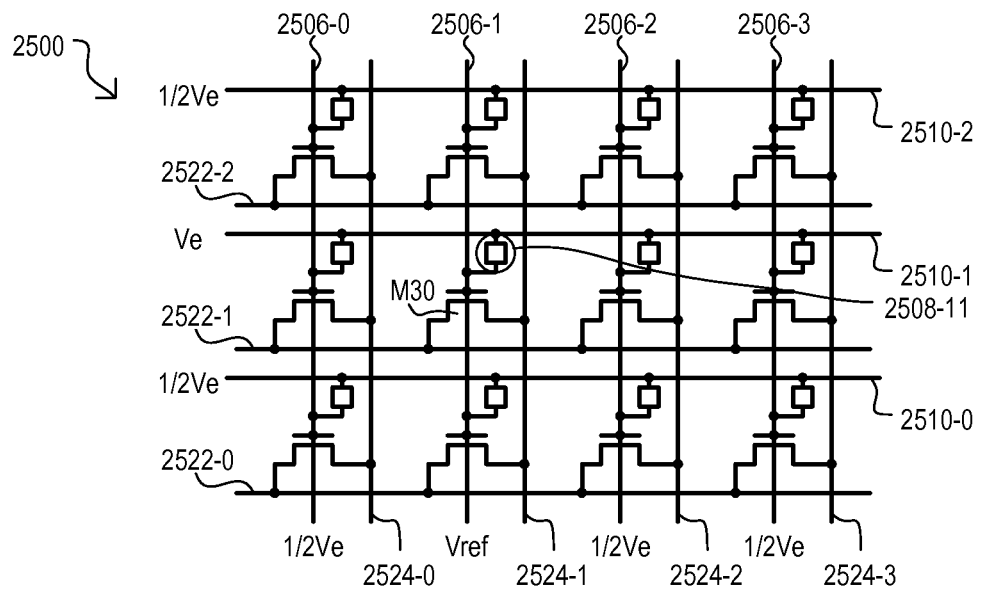

FIG. 25B shows one example of an erase operation for memory device 2500. An erase operation may occur in a manner like that shown for FIG. 25B, with a sufficient erase voltage being applied between appropriate word lines 2506-0-2 and select lines 2510-0-2 to change a state of an element. FIG. 25B particularly shows the erasing of an element 2508-11.

Figure 25C:
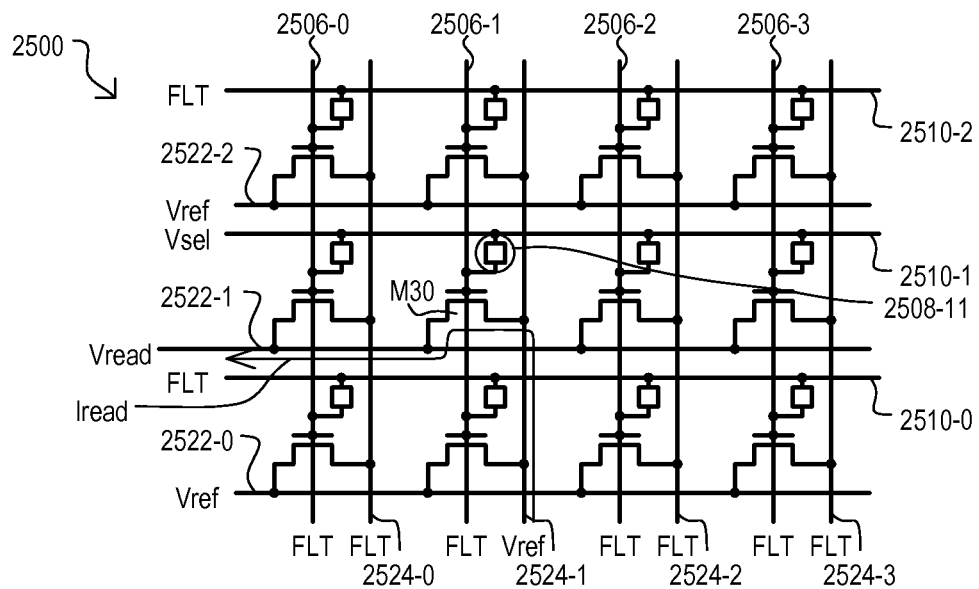

FIG. 25C shows one example of a read operation for memory device 2500. As in the case of FIG. 24C, a select voltage on a select line may be applied through an element to a word line. Thus, a source-drain path of an access transistor connected to the word line may have an impedance that varies according the state of the element.

In the example of FIG. 25C, data is read from programmable element 2508-11. Both selected and un-selected word lines 2506-0-3 may be isolated from direct driving circuits (e.g., floated), to thereby enable such word lines to be driven by select lines through elements.

Un-selected source lines 2524-0,2,3 may be floated. Accordingly, if an access transistor connected to such a floated source line is enabled, current may not flow through such an access transistor. In contrast, a selected source line 2524-1 may be driven to a predetermined source read voltage, which in the example shown, is Vref.

As in the case of FIG. 24C, in FIG. 25C un-selected select lines 2510-0,2 may be floated, while a selected select line 2510-1 may be driven to a select voltage Vsel. If selected element 2508-11 has a relatively low impedance, a large amount of voltage Vsel on select line 2510-1 may be applied to a gate of transistor M30, resulting in a relatively large read current (Iread). If a selected element 2508-11 has a relatively high impedance, less of voltage Vsel on select line 2510-1 may be applied to transistor M30 resulting in a relatively small read current (Iread).

Figure 25D:
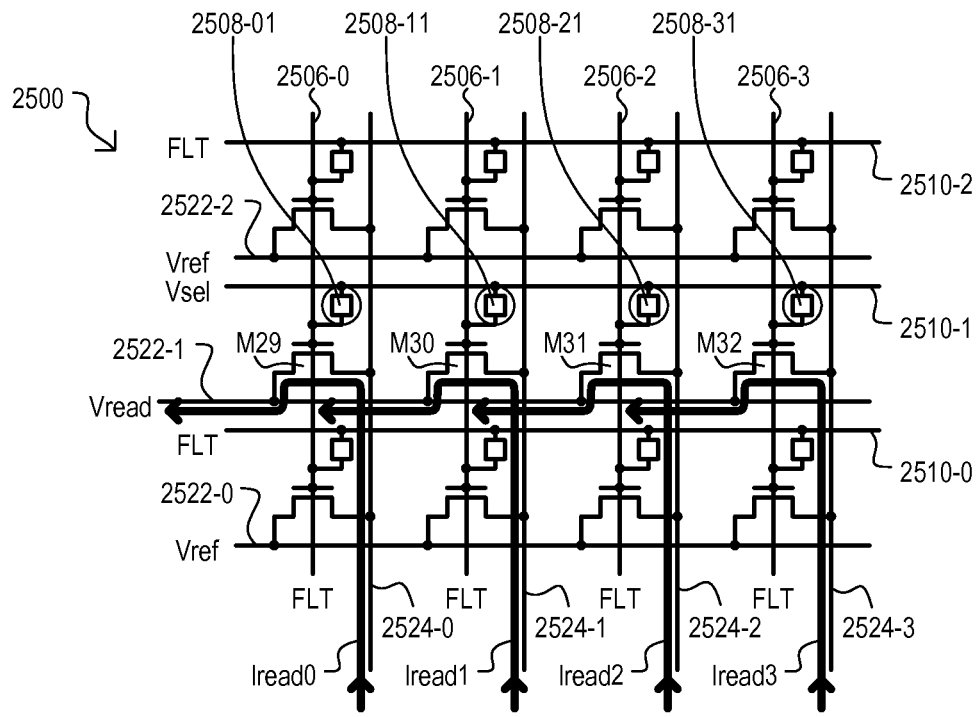

FIG. 25D shows another example of a read operation for memory device 2500. In FIG. 25D, a select voltage on a select line may be applied through multiple elements to corresponding word lines. Thus, a source-drain path of an access transistor connected to the word line may have an impedance that varies according the state of the element.

In the example of FIG. 25D, data may be read from programmable elements 2508-01 to 2508-31 in parallel. Both selected and un-selected word lines 2506-0-3 may be isolated from direct driving circuits, to thereby enable such word lines to be driven by select lines through corresponding elements.

Source lines 2524-0-3 may be initially precharged to a predetermined potential. Accordingly, if an access transistor connected to such a precharged source line is enabled, such a line may be discharged.

Un-selected select lines 2510-0,2 may be floated, while a selected select line 2510-1 may be driven to a select voltage Vsel. If selected element (2508-01 to 2508-31) has a relatively low impedance, a large amount of voltage Vsel on select line 2510-1 may be applied to a gate of a corresponding transistor (M29 to M32, respectively), resulting in a relatively large read current (Iread0 to Iread3). If a selected element (2508-01 to 2508-31) has a relatively high impedance, less of voltage Vsel on select line 2510-1 may be applied to a corresponding transistor (M29 to M32, respectively), resulting in a relatively small read current (Iread0 to Iread3).

Figure 26:
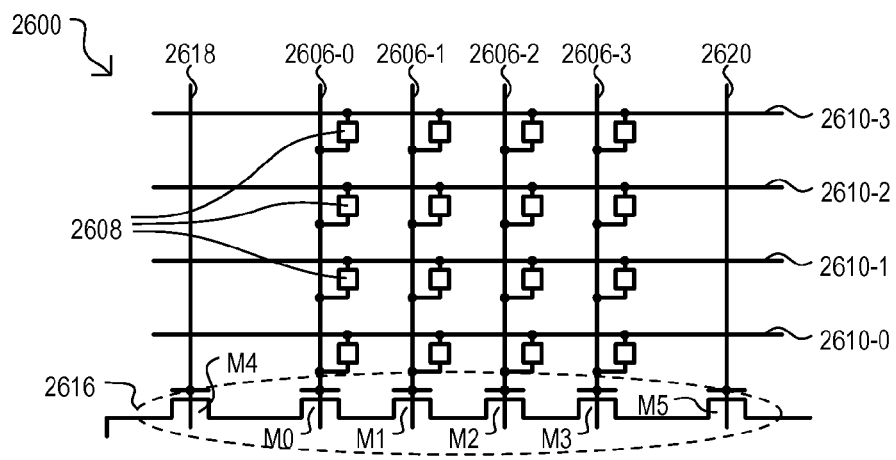
FIG. 26 is a schematic diagram showing a memory device according to an embodiment having one group of access transistors for a cross-point array.

FIG. 26 shows a memory device 2600 according to another embodiment. Memory device 2600 may include an element layer, like that shown in FIG. 24A, including programmable impedance elements (some shown as 2608) connected between select lines 2610-0-3 and word lines 2606-0-3.

Memory device 2600 may differ from that of FIG. 24A in that a transistor layer may have but one transistor group 2616 corresponding to an element layer.

Program, erase and read operations may occur in the fashion shown for FIGS. 24A to 24C.

Figure 27:
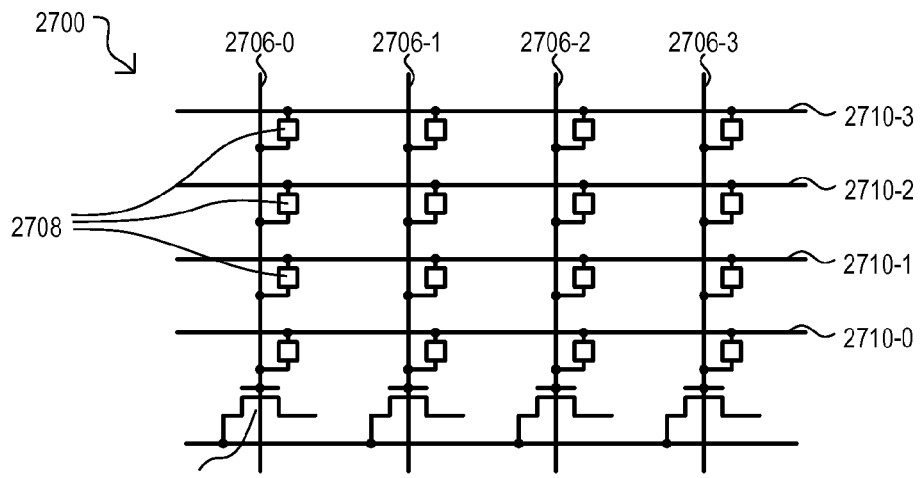
FIG. 27 is a schematic diagram showing a memory device according to an embodiment having one access transistor for each word line of a cross-point array.

FIG. 27 shows a memory device 2700 according to a further embodiment. Memory device 2700 may include an architecture similar to that of FIGS. 25A to 25C, however, one access transistor (e.g., M50) may be connected to each word line 2706-0-3.

Program, erase and read operations may occur in the fashion shown for FIGS. 25A to 25C.

Figure 28:
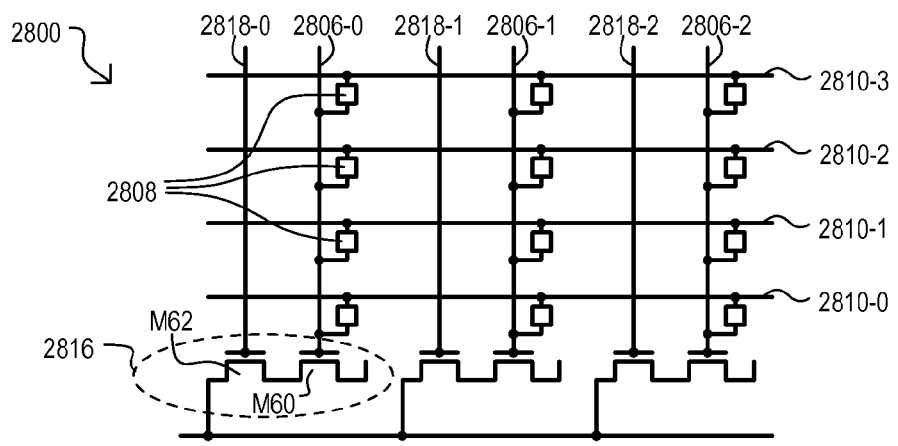
FIG. 28 is a schematic diagram showing a memory device according to an embodiment having an access/select transistor pair for each word line of a cross-point array.

FIG. 28 shows a memory device 2800 according to another embodiment. Memory device 2400 may include an architecture similar to that of FIGS. 24A to 24C. However, in a transistor layer, each access transistor (e.g., M60) may have one corresponding select transistor (e.g., M62).

Program, erase and read operations may occur in the fashion shown for FIGS. 24A to 24C.

Figure 29:
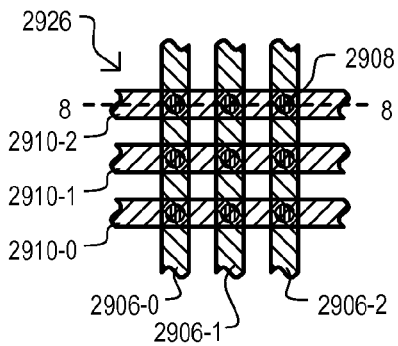
FIG. 29 is a top plan view of a cross-point array that can be included in embodiments.

FIG. 29 shows a top plan view of a cross-point array 2926 that may be included in embodiments. Select lines 2910-0-2 may be disposed in one direction (horizontal in the particular view), while word lines 2906-0-2 may be disposed in another direction (vertical in the particular view). Programmable impedance elements (one shown as 2908) may be formed at intersections of select lines 2910-0-2 and word lines 2902-0-2.

Figure 30:
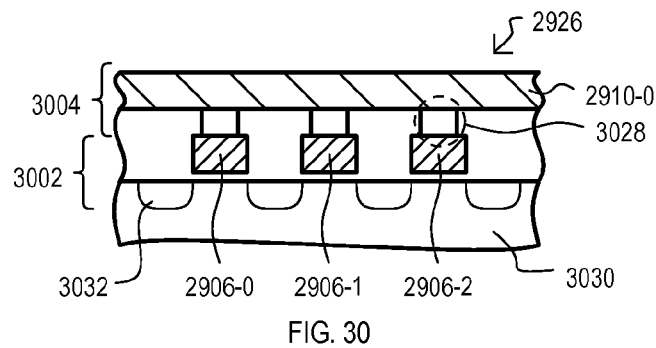
FIG. 30 is a side cross sectional view of a cross-point array that can be included in embodiments.

FIG. 30 shows one example of a side cross sectional view of cross-point array 2926 taken along line 8-8 of FIG. 29.

In the example shown, word lines 2906-0-2 may be formed on a semiconductor substrate 3030, and may integrally form control gates for access transistors. Source/drain regions (one shown as 3032) may be formed in substrate 3002, and reflect an access transistor arrangement like that shown in FIG. 24A.

A select line 2910-0 may be formed over word lines 2906-0-2. Programmable impedance structure (one shown as 3028) may be formed at crossing points of word lines 2906-0-2 and select line 2910-0. Programmable impedance structures (e.g., 3028) may provide an impedance value that may be alterable to thereby store a data value. In some embodiments, elements (e.g., 3028) may include a solid ion conductor material. In particular embodiments, elements (e.g., 3028) may include programmable metallization cells (PMCs).

Cross-point array 2926 may be formed by creating a gate insulating layer, forming a gate layer on the gate insulating layer, patterning the gate layer to create control terminals and word lines. Optionally, a highly conductive material (e.g., silicide) may be formed on a gate layer. One or more insulating layers may then be formed over word lines. At locations where programmable impedance structures are to be formed, openings may be formed in such insulating layer(s). All or corresponding portions of programmable impedance structures may be formed in such openings. Select lines may then be formed in contact with programmable impedance structures.

FIGS. 31A to 31D show particular examples of programmable impedance structures that may be included in embodiments disclosed herein. Each of FIGS. 31A to 31D shows a select line 3110, a corresponding word line 3106, and a solid ion conductor 3132-A-D. A solid ion conductor may be formed between an "active" electrode and an "indifferent" electrode. An active electrode may include one or more elements that may provide a source of conductive ions for solid ion conductor. An indifferent electrode may not include elements that may provide a source of conductive ions for solid ion conductor.

Figure 31A:
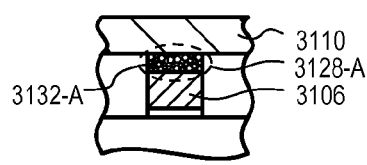
FIGS. 31A to 31D are side cross sectional views of programmable impedance elements that can be included in embodiments.

FIG. 31A shows an arrangement in which a solid ion conductor 3132-A is formed directly between a word line 3106 and a select line 3110. In such an arrangement, all or a portion of one of word line 3106 or select line 3110 may form an active electrode, while the other of select line 3110 or word line 3106 may form an indifferent electrode.

Figure 31B:
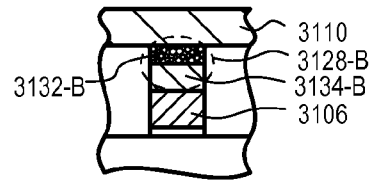

FIG. 31B shows an arrangement in which a solid ion conductor 3132-B may be formed directly on a select line 3110. However, a programmable impedance structure 3128-B may include a contact portion 3134-B between solid ion conductor 3132-B and a word line 3106. Accordingly, a select line 3110 or contact portion 934-B may form an active electrode.

Figure 31C:
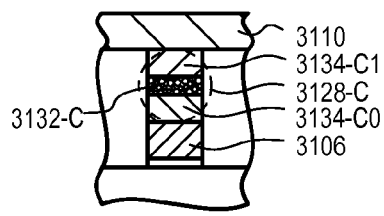

FIG. 31C shows an arrangement in which a programmable impedance structure 3128-C may include a first contact portion 3134-C0 between a solid ion conductor 3132-B and a select line 3110, and a second contact portion 3134-C1 between a solid ion conductor 3132-C and a word line 3106. Accordingly, one of contact portions 3134-C0 or 3134-C1 may form an active electrode, while the other of contact portions 3134-C1 or 3134-C0 may form an indifferent electrode.

Figure 31D:
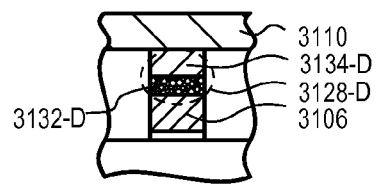

FIG. 31D shows an arrangement in which a solid ion conductor 3132-D may be formed directly on a word line 3106. However, a programmable impedance structure 3128-D may include a contact portion 3134-D between solid ion conductor 3132-B and a word line 3106. Accordingly, a word line 3106 or contact portion 3134-D may form an active electrode.

Figure 32:
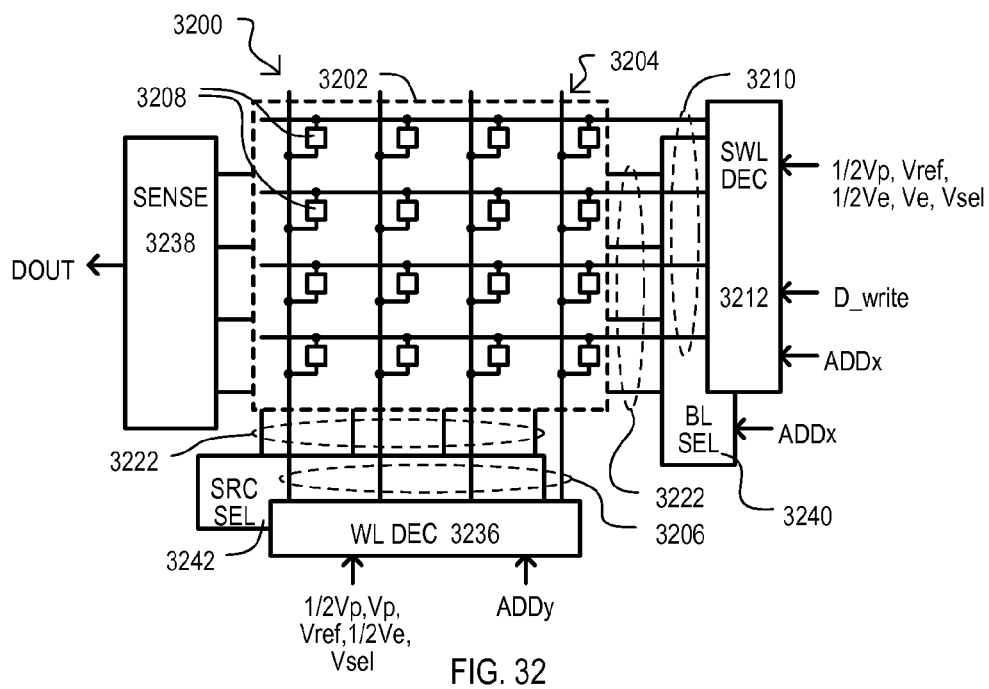
FIG. 32 is a schematic diagram showing a memory device according to another embodiment.

Referring now to FIG. 32, a memory device according to another embodiment is shown in a block schematic diagram, and designated by the general reference character 3200. A memory device 3200 may include a transistor layer 3202 and an element layer 3204 according to any of the embodiments shown herein, or equivalents. A memory device 3200 may further include a select voltage circuit 3212, a word line decoder/driver circuit 3236, a sense circuit 3238, and optionally, a bit line selection circuit 3240 and/or a source selection circuit 3242.

A select voltage circuit 3212 may receive voltages utilized in program, erase and read operations (in this example ½Vp, Vref, ½Ve, Vsel, Ve). In program and erase operations, in response to address data (ADDx) and write data, a select voltage circuit 3212 may apply particular voltages to select lines to enable the programming and/or erasing of corresponding elements. In a read operation, select voltage circuit 3212 may apply voltages to predetermined select lines, or isolate such lines (e.g., float such lines) based on a read address value (ADDx). In particular embodiments, voltages can be applied to select lines or select lines may be isolated according to embodiments shown herein, or equivalents.

A word line decoder/driver circuit 3236 may receive voltages utilized in program, erase and read operations (in this example ½Vp, Vp, Vref, ½Ve, Vsel). In program and erase operations, in response to address data (ADDy), word line decoder/driver circuit 3236 may apply particular voltages to word lines to enable the programming and/or erasing of selected elements. In a read operation, word line decoder/driver circuit 3236 may drive word lines to predetermined voltages (or float such lines) based on address values (ADDy). In particular embodiments, voltages can be applied to word lines, or word lines allowed to "float", according to embodiments shown herein, or equivalents. In some embodiments, a word line decoder/driver circuit 3236 may also drive group select lines, such as those shown as 2418 and 2420 in FIG. 24A, for example (lines that control a select device for a series of access devices).

In a read operation, a sense circuit 3238 may detect a current and/or a voltage generated according to a selected programmable impedance element. In some embodiments, a sense circuit 3238 may generate a read data value DOUT based on a current flowing through an access transistor having a control terminal potential determined by a state of a selected element.

A bit line selection circuit 3240 may select bit lines connected to transistors of a transistor layer 3202 for read, program and/or erase operations, by enabling electrical connections between bit lines and access transistors of a transistor layer 3202. In some embodiments, such selection may be based on an address value (e.g., ADDx).

A source selection circuit 3242 may apply particular voltages to a source line (or float such lines) to enable the reading of data from selected elements. As but one example, a source selection circuit 3242 may drive (or isolate) source lines in a manner like that described in FIGS. 25A to 25C.

Figure 33:
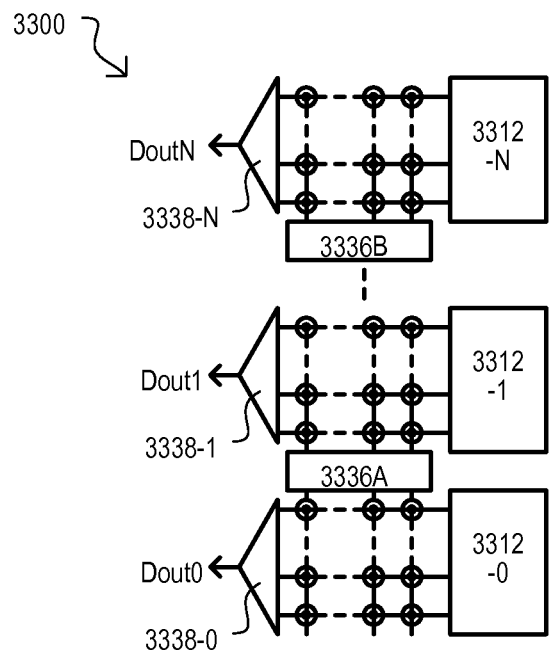
FIG. 33 is a schematic diagram showing a memory device according to a further embodiment that can repeat structures like those shown in FIG. 32.

Referring now to FIG. 33 shows memory device 3300 according to another embodiment.

In embodiments above, like those shown in FIGS. 24C, 25C, and 26-28, data for one element may be read at a time. Memory device 3300 may repeat structures like those shown in FIG. 10 multiple times to provide multiple read bits at one time. Thus, a memory device 3300 can include multiple sub-word line decoders 3312-N to -0, multiple word line decoders 3336-NB, and multiple sense circuits 3338-N to -0. Such an arrangement can provide an output of N+1 data values DoutN to Dout0.

Figure 34:
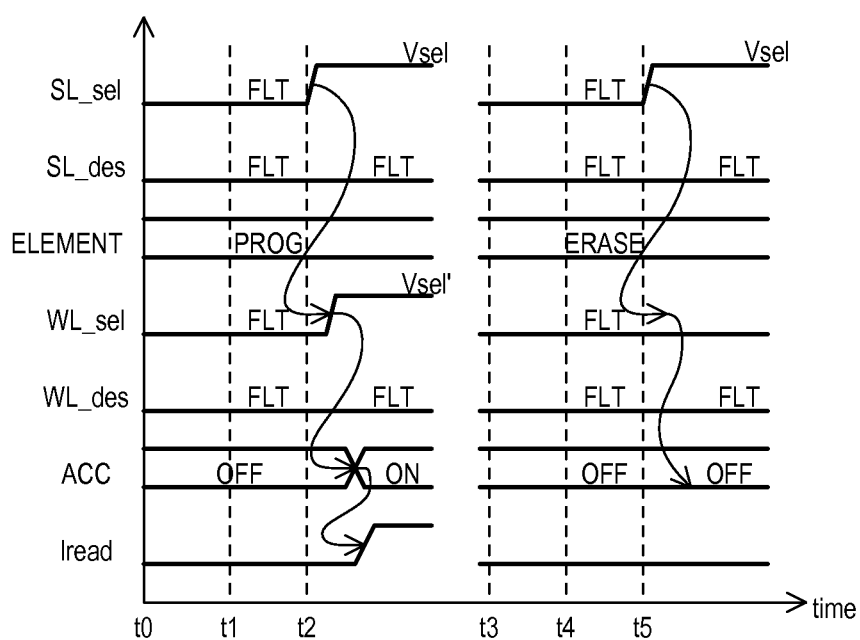
FIG. 34 is a timing diagram showing a read method according to an embodiment.

Referring now to FIG. 34, a read method according to an embodiment is show in a timing diagram. FIG. 34 includes waveforms: SL_sel shows a selected select line voltage, SL_des shows an un-selected select line voltage, WL_sel shows a selected word line voltage, WL_des shows an un-selected word line voltage, ELEMENT shows a state of an element that is read, ACC shows a state of an access transistor, and Iread shows a read current.

At about time t0, select lines and word lines may all be low (SL_sel, SL_des, WL_sel, WL_des) thus access transistor may be in a high impedance state (in this example, ACC=OFF). With the access transistor off, a read current (Iread) may be low or substantially zero.

At about time t1, word lines and select lines may be isolated (i.e., floated) (SL_sel=SL_des=WL_sel=WL_des=FLT).

At about time t2, a selected select line may be driven high (SL_sel=Vsel), while un-selected lines may remain isolated (i.e., floated) (SL_des=FLT). In the example shown, because an element is programmed (ELEMENT=Prog), a voltage from select line (SL_sel) may be applied through the element to the selected word line, causing such a word line to be driven to, or about, the select voltage (WL_sel=Vsel'). In contrast, an un-selected word line may remain floating (WL_des=FLT), as un-selected select lines connected to such a word line may remain floating. In response to a selected word line WL_sel being driven to a select voltage, a corresponding access device may be placed into a low impedance (ACC=ON). With the access transistor on, a read current (Iread) may be relatively large.

At about time t3, select lines and word lines may return low, as noted for time t0.

At about time t4, select lines and word lines may be isolated, as noted for time t1.

At about time t5, a selected select line may be driven high (SL_sel=Vsel), while un-selected lines may remain isolated (i.e., floated) (SL_des=FLT). Operations may continue as noted for time t2. However, because an element is erased (ELEMENT=Erase), a voltage from select line (SL_sel) may not be applied to the selected word line through the selected element. As a result, a selected word line may remain at, or about, a low voltage (WL_sel=Low). In response to a selected word line WL_sel remaining low, a corresponding access device may be remain in a high impedance (ACC=OFF). With the access transistor off, a read current (Iread) may be relatively low.

While embodiments have shown program and erase operations with two sets of voltages, other embodiments may include multiple program and/or erase voltage to enable a programmable impedance element to represent more than two data states.

Figure 35:
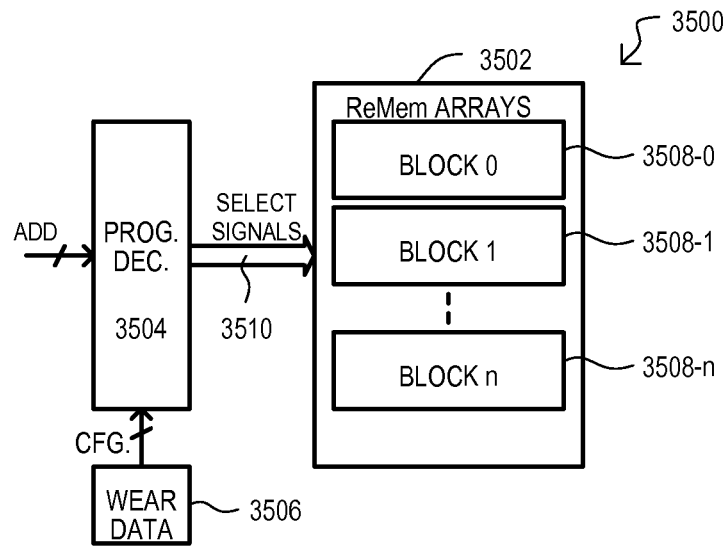
FIG. 35 is a block schematic diagram of a memory device having a programmable decoder according to an embodiment.

Referring now to FIG. 35 a memory device according to an embodiment is shown in a block schematic diagram and designated by the general reference character 3500. Memory device 3500 may include a memory section 3502, a programmable decoder 3504, and a wear data source 3506.

A memory device 3500 may include blocks 3508-0 to 3508-$n$. Blocks 3508-0-$n$ may include a number of memory cells, each of which may store a data value according to one or more programmable impedance elements. Programmable impedance elements may have impedance values that may be set to store data in a nonvolatile and/or volatile fashion. In a very particular embodiment, programmable impedance elements may include programmable metallization cells (PMCs), as described herein.

Memory cells within blocks 3508-0-$n$ may be accessed by select signals 3510. In particular, in response to particular select signals, all or a portion of the memory cells within a block may be accessed to write data values into such memory cells. In one embodiment, blocks 3508-0-$n$ may be subject to a block erase operation and/or block program operation in which substantially all memory cells of the same block may be written to one value.

Programmable impedance elements within memory cells of blocks 3508-0-$n$ may be subject to wear dependent variations. Wear dependent variations may result from repeated writes to an element. In such cases, wear dependent variations take numerous forms, including but not limited to: changes in the impedance range and/or limit to which an element may be programmed/erased, changes in the write voltage and/or current and/or temperature needed to achieve a desired impedance in a given time period or number of cycles, changes in the time and/or number of write cycles needed to achieve a desired impedance.

A programmable decoder 3504 may receive logical address values (ADD) and decode such values into select signals 3510. How such a decoding operation takes place may vary according to configuration data CFG received from a wear data source 3506. In one embodiment, a programmable decoder 3504 may include logic circuits that combine logical address values (ADD) with configuration values (CFG) to generate select signals 3510. It is noted that this is in contrast to block re-mapping approaches that may include look-up tables or the like to translate a received logical address into a physical address that may be subsequently decoded into a select signals.

Select signals 3510 may enable access to blocks 3508-0/$n$. Select signals 3510 may include block select signals that are activated to enable access to a block. In one particular embodiment, such signals may include block select signals for activating one or more blocks. In addition or alternatively, such signals may include row select signals that may access particular rows (and/or banks) of memory cells within a block. Still further, in some embodiments select signals may include column select signals for accessing particular columns of memory cells within a block.

Figure 36:
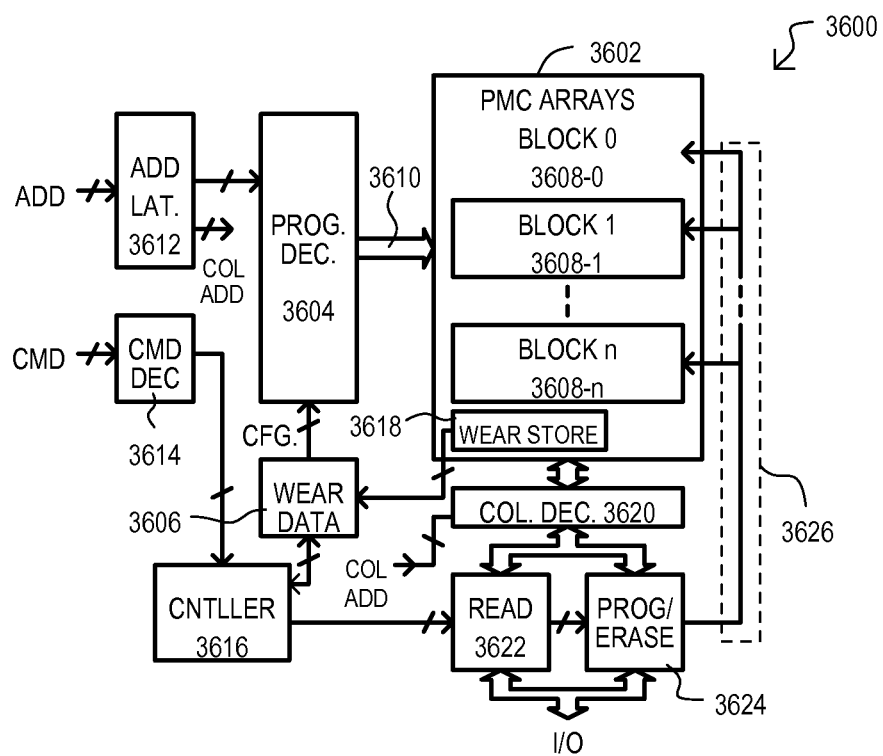
FIG. 36 is a block schematic diagram of a memory device having a programmable decoder according to another embodiment.

Referring now to FIG. 36 a memory device according to another embodiment is shown in a block schematic diagram and designated by the general reference character 3600. Unlike FIG. 35, FIG. 36 shows an address latch 3612, a command decoder 3614, a controller 3616, a wear data store 3618, a column decoder 3620, read circuits 3622, and a write circuits 3624, An address latch 3612 may latch logical address values (ADD) received from a request source. Logical address values (ADD) may identify a location for a read or write (e.g., program or erase) operation. In the very particular embodiment shown, address latch 3612 may output one portion of a logical address to a programmable decoder 3604, and another portion to a column decoder 3622. Logical address values (ADD) may be received directly, via dedicated address input or bus, or may be received indirectly, via a multiplexed or some other shared input.

A command decoder 3614 may receive command input signals (CMD) and decode such signals for a controller 3616. As in the case of logical address signals, command input signals may be received directly, via a dedicated control inputs or bus, or may be received indirectly, via a multiplexed or some other shared input.

A controller 3616 may control operations in a memory device 3600. In one embodiment, a controller 3616 may control read operations and write operations (which may include any of byte-wise program operations, byte-wise erase operations, block erase operation and/or block program operations). In addition, a controller 3616 may control block accesses based on wear leveling.

In the very particular example shown, a controller 3616 may receive inputs from a command decoder 3614 and thereby determine an operation to execute. Further, a controller 3616 may access a wear data source 3618 to dynamically determine which blocks (3608-0/$n$) correspond to which address range, based on a wear leveling routine. Controller 3616 may control read circuits 3622 to enable data to be read out of a block (3608-0/$n$). Similarly, controller 3616 may control write circuits 3624 to enable writing of data, which in this example may include, programming and erasing of memory cells.

A memory section 3602 may also include a wear data store 3618. Accordingly, if memory section 3602 includes memory cells with nonvolatile programmable impedance elements, wear data store 3618 may store wear data for each block 3608-0/$n$ with the same type of memory cells. In one embodiment, wear data may be a count value for each block 3608-0/$n$. In other embodiments, a wear value may be a flag, or other indication, that may signify which block should be accessed according to a wear leveling routine. In addition or alternatively, a wear data store 3618 may indicate block substitution should be performed for other purposes, including but not limited to, failures in a block and/or a block has parameters that are out of limits.

A column decoder 3620 may selectively enable data paths between read and write circuits (3622 and 3624) based on address values. In some embodiments, a column decoder 3620 may be a programmable decoder 3604.

Read circuits 3622 may include sense amplifiers, or the like, that may sense the impedance of accessed memory cells. In the particular embodiment shown, a column decoder 3620 may be situated between read circuits 3622 and memory section 3602. However in alternate embodiments, a read circuit 3622 may be situated between column decoder 3620 and memory section 3602.

Write circuits 3624 may provide and apply voltages to blocks (3608-0/n) to write data into memory cells. In one embodiment, write circuits 3624 may include both program and erase circuits. Even more particularly, program circuits may provide and apply voltages that "program" memory cells to a particular state (e.g., logic 1), while erase circuits may provide and apply voltages that "erase" memory cells to a particular state (e.g., logic 0). In one embodiment, memory cells may include PMCs as storage elements, and program circuits may program such elements to a low resistance state, while erase circuits may erase such elements to a high resistance state.

Write circuits 3624 may perform random access (i.e., byte writes) program operations (and in some embodiments, random access erase operations). However, write circuits 3624 may also perform block erase (and in some embodiments block program operations) that may write a same value to all, or substantially all, memory cells of a block. In the particular embodiment shown, write circuits 3624 may access blocks (3608-0/n) via block write controls 3626.

Referring now to FIGS. 37A and 37B, programmable decoders according to embodiments are shown in block schematic diagrams.

FIG. 37A shows a programmable decoder 3704 that may be included in the embodiments. In the embodiment shown, programmable decoder 3704 includes a row decoder 3728 and a programmable block decoder 3730.

A row decoder 3728 may receive a portion of a logical address (ADD) and generate row select signals ROWSEL. In this particular embodiment, row select signals ROWSEL are not configurable.

A block decoder 3730 may receive another portion of a logical address (ADD) and logically combine such signals with configuration data (CFG) to generate block select signals BLSEL. Thus, block select signals BLSEL may be programmable, providing a different decoding function in response to configuration values (CFG).

FIG. 37B shows another programmable decoder 3704' that may be included in the embodiments. In the embodiment shown, programmable decoder 3704' includes a programmable row decoder 3728' and a block decoder 3730'.

A row decoder 3728' may receive a portion of a logical address (ADD) and logically combine such signals with configuration data (CFG) to generate row select signals ROWSEL. Thus, row select signals ROWSEL may be programmable, providing a different decoding function in response to configuration values (CFG).

A block decoder 3728' may receive a portion of a logical address (ADD) and generate block select signals BLSEL. Thus, in this particular embodiment, block select signals BLSEL are not configurable.

FIG. 38 shows one example of a memory cell array 3832 that may be included in blocks according to embodiments. Memory cell array 3832 may include memory cells (four shown as 3834-00 to -11). Memory cells 3834-00 to -11 may be arranged into rows and columns, with memory cells of a same row being connected to a same word line 3836-0/1, and memory cells of a same column being connected to a same bit line 3838-0/1.

In one embodiment, each memory cell (e.g., 3834-00 to -11) may include an access device that may connect a programmable impedance element to a bit line 3838-0/1 based on a voltage of the corresponding word line (e.g., 3836-0/1). In the particular example shown, an access device may be an n-channel transistor, while a programmable impedance element may be a PMC.

The array architecture and memory cell type shown in FIG. 38 is but one example of that which may be included in memory devices according to the embodiments. Other embodiments may include different architectures and/or memory cell types.

FIG. 39 shows one example of an interface that may be included in a memory device according to an embodiment.

An interface 3940 may receive address data, command data, write data, and output read data on same inputs/outputs (DQs). In the embodiment shown, an interface 3940 may include a latch control circuit 3942, an address latch 3944, a command latch 3946, and a data latch 3948. A latch control circuit 3942 may enable any of address, command or data latches (3944, 3946, 3948) in response to control signals. Such control signals may be advantageously compatible with existing memory devices, and in this example may include an address latch enable signal ALE, to latch address values on DQs, a command latch enable signal CLE to latch command data on DQs, and a write enable signal WE, to latch write data on DQs.

Address latch 3944 may latch address data and output all or a portion of such data to a programmable decoder (e.g., 3504, 3604, 3704). A command latch 3946 may latch command data, and provide such data to a command decoder (e.g., 3614) and/or controller circuit (e.g., 3616). A data latch 3948 may provide write data to a write circuit (e.g., 3624), and/or receive read data from a read circuit (e.g., 3622).

FIG. 40 shows an example of another interface that may be included in a memory device according to an embodiment.

An interface 4040 may receive address data and command data in separate inputs, and receive write data and output read data on same inputs/outputs (DQs). In the embodiment shown, an interface 4040 may include a command decoder 4016, an address latch 4012, and a data latch 4048. A command decoder 4016 may receive control signals to indicate a type of command. Such control signals may be advantageously compatible with existing memory devices, and in this example may include a row address strobe signal (RAS), a column address strobe signal (CAS), a chip select signal (CS) and a write enable signal (WE). Combinations of such signals may be utilized to signify various operations, including but not limited to a read and write operations.

Still further, while particular embodiments may include programmable impedance elements that store data in a substantially nonvolatile fashion, in other embodiments, memory cells may have programmable impedance elements that store an impedance value in a substantially volatile fashion. In such embodiments, input signals (e.g., RAS, CAS, CS, WE) may be utilized to initiate "refresh" operations that may rewrite impedance values into memory cells in response to events other than read or write requests.

Figure 41A:
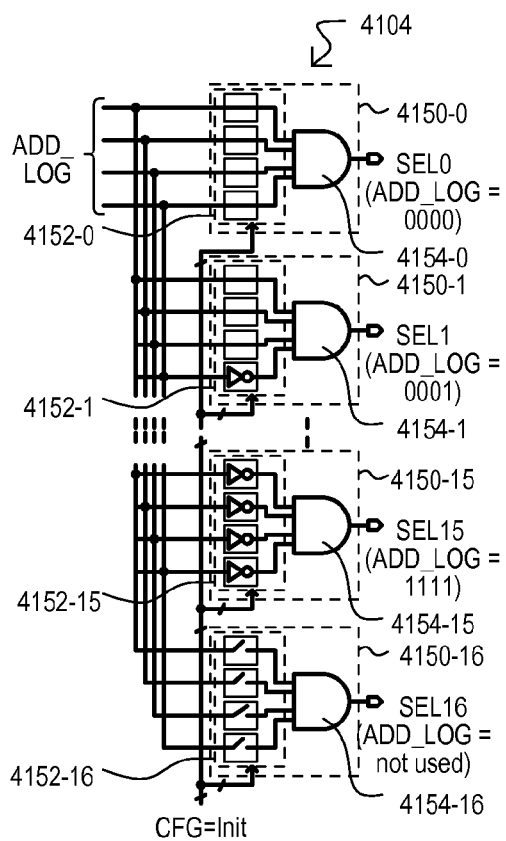
FIGS. 41A to 41C are schematic diagrams of a programmable decoder that can be included in embodiments.
Figure 41B:
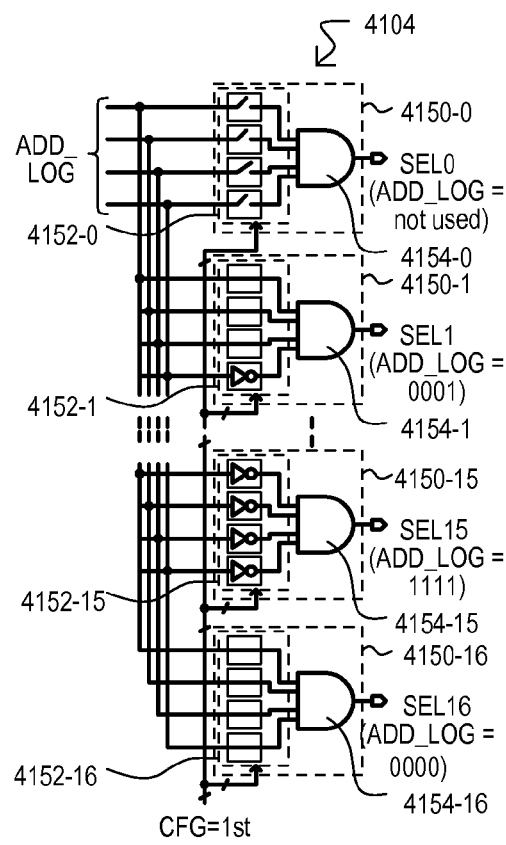
Figure 41C:
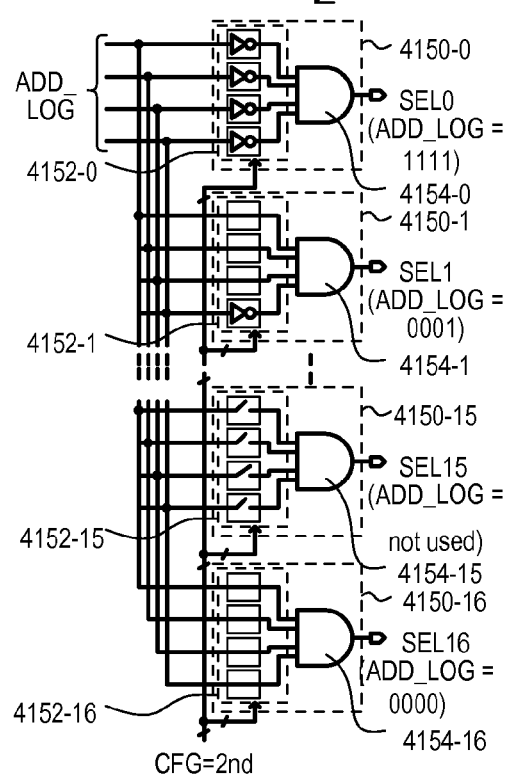

FIGS. 41A to 41C show one particular example of a programmable decoder 4104 as well as configuration operations for such a programmable decoder. A programmable decoder 4104 may receive logical address signals ADD_LOG, as well as configuration values CFG. In response to such signals, a programmable decoder 4104 may activate any of a number of select signals SEL0 to SEL16.

A programmable decoder 4104 may include a number of decoder sections 4150-0 to -16, each of which may activate a select signal SEL0-16. In one embodiment, each select signal SEL0-16 may enable access to one portion (e.g., block) of a memory device. In the very particular embodiment shown, each decoder section 4150-0-16 may include a programmable section 4152-0-16 and a logic section 4154-0-16.

Each programmable section 4152-0-16 may vary its operation in response to configuration values CFG. In the embodiment shown, each programmable section 4152-0-16 may provide a non-inverting path, or an inverting path, or force its decoder section into a disabled state.

Each logic section 4154-0-16 may combine received logical address signals (ADD_LOG), as modified by configuration values CFG. In the particular example of FIG. 41A, a logic section 4154-0-16 may be an AND gate.

FIG. 41A shows an arrangement with initial configuration values (CFG=Init). In such an arrangement, a programmable decoder 4104 may activate select signals SEL0 to SEL15 in response to logical addresses (ADD_LOG) 0000 to 1111, respectively. Select signal SEL16 remains inactive, and may correspond to a spare block. It is understood that logical addresses ADD_LOG may be one portion of a larger read or write address.

FIG. 41B shows the same programmable decoder of FIG. 41A, but with different configuration values (CFG=$1^{st}$). In such an arrangement, programmable decoder 4104 now activates select signal SEL16 in response to ADD_LOG=0000, and disables select signal SEL0. As but one very particular example, such configuration values (CFG=$1^{st}$) may be generated in response to a wear leveling routine that determines that a block corresponding to select signal SEL0 has a wear profile that makes the block the best candidate for substitution.

FIG. 41C shows an arrangement with another set of configuration values (CFG=2nd). In such an arrangement, programmable decoder 4104 now activates select signal SEL0 in response to ADD_LOG=1111, and disables select signal SEL15. As but one very particular example, such configuration values (CFG=2nd) may be generated in response to a wear leveling routine that determines that a block corresponding to select signal SEL15 has a wear profile the makes the block the best candidate for substitution.

FIGS. 41A to 41C show but one embodiment of a programmable decoder. Other embodiments may include different programmable circuits.

Figure 42A:
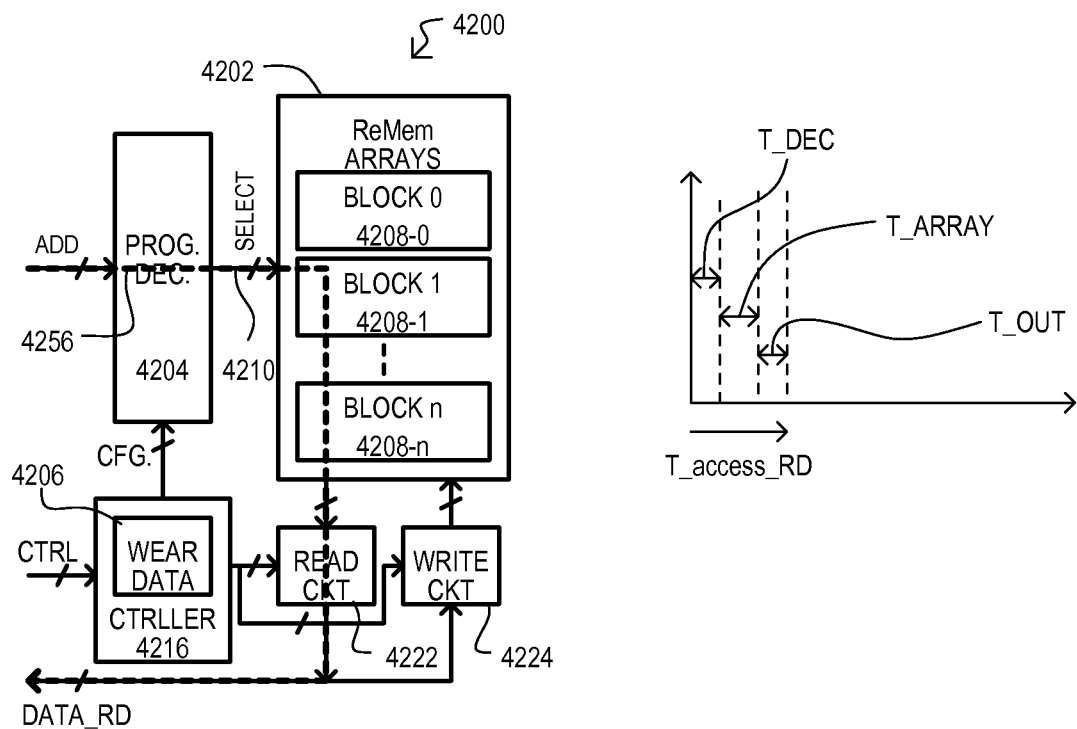
FIGS. 42A and 42B are block schematic diagrams of a memory device and timing diagrams showing read and write operations according to embodiments.
Figure 42B:
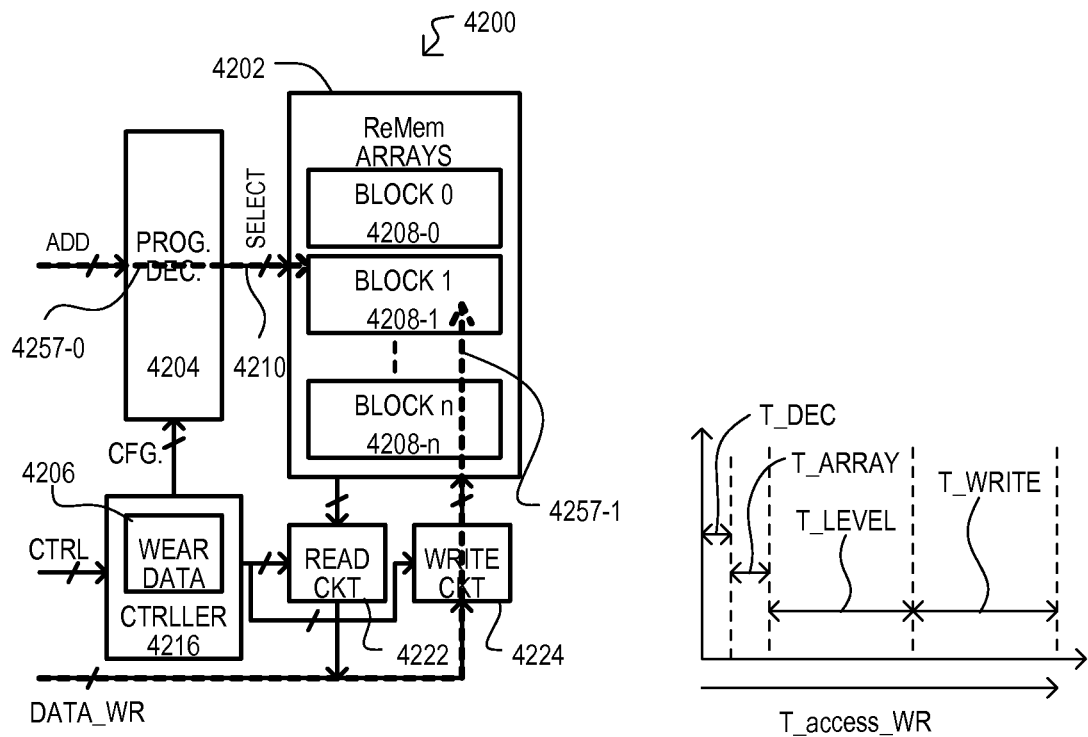

FIGS. 42A and 42B are block schematic diagrams and timing diagrams showing differences in read and write access times according to embodiments. FIGS. 42A and 42B show a device 4200 that can include sections like those of FIG. 36. Such like sections have the same reference characters but with the first two digits being "42" instead of "36".

FIG. 42A shows a read operation, including a read path 4256, and a corresponding timing diagram for such an operation. In a read operation, address values may be applied to a programmable decoder 4204 to generate select signals 4210 as described herein and equivalents. In the particular read path shown, a received logical address ADD may select BLOCK 1 4208-1. In response to such a selection, read circuits (e.g., data sensing circuits) may generate read data which may then be output as read data (DATA_RD).

Referring to the timing diagram of FIG. 42A, in one very particular embodiment, a read access time (T_access_RD) may include an address decoding time (T_DEC), an array access time (T_ARRAY), and a data output time (T_OUT). An address decoding time (T_DEC) may be the time between reception of a valid logical address value, and the generation of select signals 4210. An array access time (T_ARRAY) may be the time between application of select signals 4210 and the generation of valid read data values. A data output time (T_OUT) may be the time between the generation of read data values, and when such data values are available at a data output.

It is noted that the access time and data read path shown in FIG. 42A may be in contrast to block based memories in which all addresses pass through an address re-mapping circuit, such as a look-up table or the like.

FIG. 42B shows a write operation, including a write command path 4257-0 and a write data path 4257-1, and a corresponding timing diagram for such an operation. In a write operation, address values may be applied to a programmable decoder 4204 to generate select signals 4210 as described herein and equivalents. In the particular write path shown, a received logical address ADD may select BLOCK 1 4208-1. In addition, write data DATA_WR may be applied via write data path 4257-1. It is understood that application of write data can be a two part process, including a block write of one value (e.g., a block erase), and then the data dependent writing of another value (e.g., programming of data).

Referring to the timing diagram of FIG. 42B, in one very particular embodiment, a write access time (T_access_WR) may include an address decoding time (T_DEC) and an array access time (T_ARRAY), like that for FIG. 42A. However, T_access_WR may further include a wear level routine time (T_LEVEL) as well as a write time (T_WRITE). A wear level routine time (T_LEVEL) may be the time needed for a controller to execute a wear leveling operation in response to received write data. Such a wear leveling operation may include comparing a write count value to predetermined count values to determine if data should be stored in a different block. A write time (T_WRITE) may be the time included in applying data and appropriate voltages to write data to a desired portion of a block within memory section 4202. As noted above, in some embodiments, such a write time may include block based write operations, including but not limited to, erasing an entire block to one data value, then programming selected bits of the block to another data value based on write data and/or programming an entire block to one data value, then erasing selected bits of the block to another data value based on write data.

Referring now to FIG. 43, a method according to another embodiment is shown in a flow diagram and designated by the general reference character 4360. A method 4360 shows an arrangement in which a decoder may be configured in response to an erase operation.

In the embodiment shown, a method 4360 may include receiving an erase operation indication for a particular block (BLOCK N) 4362. Such an action may include receiving an indication from a controller or the like, that a block erase operation is considered for BLOCK N. As but one example, a memory device may require a block erase before data is programmed into block locations. It is understood that a value "N" may be a logical value assigned to a particular physical block.

A method 4360 may check to see if a current count value for BLOCK N is outside of some limit 4364. Such an action may include comparing a block count value for BLOCK N against a current count value limit. A count value limit may be some static value, a value relative to count values of other blocks, or value generated according to other techniques.

If a count value is not outside of a limit (N from 4364), a method 4360 may erase BLOCK N (4366) and then increment a count value for the block (4370). It is understood that in some embodiments, data values may then be programmed into the erased block.

If a count value is outside of a limit (Y from 4364), a method 4360 may change which physical block corresponds to BLOCK N (4372). A method 4360 may then reconfigure a decoder 4374 so that a logical address values directed to BLOCK N now accesses the newly assigned physical block for BLOCK N. A method may then proceed to blocks 4366 and 4370. However, when a block count is incremented, it can be a count for the newly assigned physical block.

Referring now to FIG. 44, a method according to another embodiment is shown in a flow diagram and designated by the general reference character 4460. A method 4460 shows an arrangement in which a decoder may be configured in response to a program operation.

A method 4460 may include features like those of FIG. 43, however, it is program operations and a program count value that is checked (4464) and incremented (4470), as opposed to erase operation, as is the case for FIG. 43.

It is noted that other embodiments may include combinations of all or portions of the methods shown in FIGS. 43 and 44. As but one example, some embodiments may include both program and erase count values for blocks. Thus, reconfiguring of a decoder may be based on block erase operations, block program operations, and/or combinations of such operations.

Referring now to FIG. 45, a method according to another embodiment is shown in a flow diagram and designated by the general reference character 4580. A method 4580 shows how a decoder may be reconfigured based on features of programmable impedance elements in a memory device.

A method 4580 may include checking features of one or more elements in a BLOCK N (4582). Such an operation may include determining a resistance and/or capacitance value of one, a portion, or all of the programmable impedance elements within a block to thereby determine the wear characteristics of such a block. This is in contrast to approaches like those that count operation types (e.g., block erase, block program). In addition, such an action may include checking for failures in a block.

A method 4580 may check to see if checked features for BLOCK N are outside of some limit 4584. Such an action may include comparing a memory element feature to some limit. As but a few examples, such an action may include but is not limited to: comparing a resistance value to a limit, a capacitance value to a limit, a write (e.g., erase, program) time to a limit, a read time to a limit and/or a data retention time to a limit.

If a feature of the memory elements is outside of a limit (Y from 4584), a method 4580 may change which physical block corresponds to BLOCK N (4586). A method 4580 may then reconfigure a decoder 4588 so that logical address values directed to BLOCK N access the newly assigned physical block for BLOCK N.

It is noted that other embodiments may combine a method like that of FIG. 45 with those shown in FIGS. 43 and/or 44.

A memory device and method according to the embodiments may be included in a standalone memory device (i.e., a memory device providing substantially only storage functions). In alternate embodiments, such a memory device may be embedded into larger integrated circuit device.

It should be appreciated that in the foregoing description of exemplary embodiments, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. An integrated circuit (IC) device, comprising:
a plurality of memory cells that store configuration data, each memory cell including a latch circuit and at least one programmable resistance element, each memory cell being coupled between a first supply voltage and a virtual supply node;
a re-configurable circuit coupled to the memory cells having a function that varies in response to the configuration data; and
a mode switch circuit having switchable paths that couple the virtual supply node between at least a second supply voltage and a write voltage, the mode switch configurable to couple the virtual supply node to the write voltage to change the programmable resistance element to a first resistance value, and to couple the virtual supply node to the second supply voltage to change the programmable resistance element to a second resistance value; wherein the second supply voltage is different than the write voltage.

2. The IC device of claim 1, wherein:
a potential difference between a write voltage and the first supply voltage is sufficient to change the at least one programmable resistance element between the first resistance value and the second resistance value.

3. The IC device of claim 1, wherein
each memory cell includes
the latch circuit having at least a first latch node and a second latch node that can latch between at least two stable states,
a first programmable resistance element coupled between the first latch node and the virtual supply node, and
a second programmable resistance element coupled between the second latch node and the virtual supply node.

4. The IC device of claim 3, wherein
the first and second programmable resistance elements comprise programmable resistance cells (PMCs) having cathodes coupled to the latch circuit and anodes coupled to the virtual supply node.

5. The IC device of claim 3, wherein
the first and second programmable resistance elements comprise programmable resistance cells (PMCs) having anodes coupled to the latch circuit and cathodes coupled to the virtual supply node.

6. The IC device of claim 3, wherein
the first and second programmable resistance elements comprise programmable resistance cells (PMCs) with one PMC having an anode coupled to the latch circuit and a cathode coupled to the virtual supply node, and the other PMC having a cathode coupled to the latch circuit and an anode coupled to the virtual supply node.

7. The IC device of claim 1, wherein
the mode switch circuit further includes a switchable path that couples the virtual supply node to a high impedance connection.

8. The IC device of claim 1, wherein
each memory cell includes
the latch circuit having at least a first latch node and a second latch node that latch between at least two stable states,
a programmable resistance element coupled between the first latch node a virtual power supply node, and
a static resistance element coupled between the second latch node and the virtual power supply node, wherein
the programmable resistance element is writable between at least a first resistance that is less than that of the static resistance element and a second resistance that is greater than that of the static resistance element.

9. The IC device of claim 1, further including
each memory cell is coupled to at least one of a plurality of bit lines; and
write circuits coupled to the bit lines and configured to drive bit lines to predetermined bit line write voltages in a write operation in response to write data;
wherein
application of the bit line write voltage to a bit line and the predetermined supply voltage to the virtual supply node is sufficient to establish a first resistance value in the at least one programmable resistance element.

10. The IC device of claim 1, wherein
each memory cell includes
a first latching active device having a first control terminal coupled to a second latch node and a first controlled impedance path coupled between a first latch node and the at least one programmable resistance element, and
a second latching active device having a second control terminal coupled to the first latch node and a second controlled impedance path coupled to the second latch node.

11. The IC device of claim 1, wherein:
the re-configurable circuit is selected from the group of: a programmable crosspoint connection circuit, a programmable multiplexer, a programmable de-multiplexer, and a programmable logic circuit.

12. The IC device of claim 1, wherein:
each memory cell includes
the latch circuits having transistors formed in a semiconductor substrate, and
the programmable resistance elements are formed over the substrate.

13. A method, comprising:
storing configuration data for a configurable circuit in memory circuits that each include a latch circuit and at least one programmable resistance element coupled between a first supply voltage and a virtual supply node that is written to at least one of a plurality of resistance values, including for each memory circuit,
driving a bit line to a bit line voltage corresponding to a data value to be stored, and
driving the at least one virtual supply node to a write supply voltage to write the programmable resistance element to a first resistance value, and driving the one virtual supply node to a second voltage to write the programmable resistance element to a second resistance value; wherein
the second voltage is different from the write supply voltage.

14. The method of claim 13, wherein
storing the configuration data includes, each memory circuit, having one programmable resistance element written to the first resistance value, and the second programmable resistance element written to a second resistance value.

15. The method of claim 13, wherein
each memory circuit further includes a static resistance element, and the plurality of resistance values includes a first resistance value greater than that of the static resistance element and a second resistance value less than that of the static resistance element.

16. The method of claim 13, further including
in response to a predetermined event, applying the configuration data to the configurable circuit to establish a function of the configurable circuit.

17. The method of claim 13, wherein
storing the configuration data includes
driving a first programmable impedance element between different potentials while allowing a second programmable impedance element to float.

18. The method of claim 13, further including
loading the configuration data into the memory circuits by driving bit lines connected to the memory circuits to values dependent upon the configuration data, and driving virtual supply nodes common to the memory circuits to a predetermined potential.

19. An integrated circuit (IC) device, comprising:
a plurality of memory cells that store configuration data, each memory cell including a latch circuit and first and second programmable resistance elements, each memory cell being coupled between a first supply voltage and a virtual supply node;
a re-configurable circuit coupled to the memory cells having a function that varies in response to the configuration data; and
a mode switch circuit having switchable paths that couple the virtual supply node between at least a second supply voltage and a write voltage; wherein
the first and second programmable resistance elements comprise programmable metallization cells (PMCs) having cathodes coupled to the latch circuit and anodes coupled to the virtual supply node; wherein the second voltage is different from the write supply voltage.

20. The IC device of claim 19, wherein
the mode switch circuit further includes a switchable path that couples the virtual supply node to a high impedance connection.

21. The IC device of claim 19, further including
each memory cell is coupled to at least one of a plurality of bit lines;
write circuits coupled to the bit lines and configured to drive bit lines to predetermined bit line write voltages in a write operation in response to write data; and
the virtual supply nodes are drivable to a predetermined supply voltage in a write operation; wherein
application of the bit line write voltage to a bit line and the predetermined supply voltage to the virtual supply node is sufficient to establish a first resistance value in the at least one programmable resistance element.

22. The IC device of claim 19, wherein
each memory cell includes
a first latching active device having a first control terminal coupled to a second latch node and a first controlled impedance path coupled between a first latch node and the at least one programmable resistance element, and a second latching active device having a second control terminal coupled to the first latch node and a second controlled impedance path coupled to the second latch node.

23. The IC device of claim 19, wherein:
the re-configurable circuit is selected from the group of: a programmable crosspoint connection circuit, a programmable multiplexer, a programmable de-multiplexer, and a programmable logic circuit.

24. The IC device of claim 19, wherein:
each memory cell includes
the latch circuits having transistors formed in a semiconductor substrate, and
the programmable resistance elements are formed over the substrate.

25. An integrated circuit (IC) device, comprising:
a plurality of memory cells that store configuration data, each memory cell including a latch circuit and first and second programmable resistance elements, each memory cell being coupled between a first supply voltage and a virtual supply node;
a re-configurable circuit coupled to the memory cells having a function that varies in response to the configuration data; and
a mode switch circuit having switchable paths that couple the virtual supply node between at least a second supply voltage and a write voltage; wherein
the first and second programmable resistance elements comprise programmable metallization cells (PMCs) having anodes coupled to the latch circuit and cathodes coupled to the virtual supply node; wherein the second voltage is different from the write supply voltage.

26. The IC device of claim 25, wherein
the mode switch circuit further includes a switchable path that couples the virtual supply node to a high impedance connection.

27. The IC device of claim 25, further including
each memory cell is coupled to at least one of a plurality of bit lines;
write circuits coupled to the bit lines and configured to drive bit lines to predetermined bit line write voltages in a write operation in response to write data; and
the virtual supply nodes are drivable to a predetermined supply voltage in a write operation; wherein
application of the bit line write voltage to a bit line and the predetermined supply voltage to the virtual supply node is sufficient to establish a first resistance value in the at least one programmable resistance element.

28. The IC device of claim 25, wherein
each memory cell includes
a first latching active device having a first control terminal coupled to a second latch node and a first controlled impedance path coupled between a first latch node and the at least one programmable resistance element, and
a second latching active device having a second control terminal coupled to the first latch node and a second controlled impedance path coupled to the second latch node.

29. The IC device of claim 25, wherein:
the re-configurable circuit is selected from the group of: a programmable crosspoint connection circuit, a programmable multiplexer, a programmable de-multiplexer, and a programmable logic circuit.

30. The IC device of claim 25, wherein:
each memory cell includes
the latch circuits having transistors formed in a semiconductor substrate, and
the programmable resistance elements are formed over the substrate.

31. An integrated circuit (IC) device, comprising:
a plurality of memory cells that store configuration data, each memory cell including a latch circuit and first and second programmable resistance elements, each memory cell being coupled between a first supply voltage and a virtual supply node;
a re-configurable circuit coupled to the memory cells having a function that varies in response to the configuration data; and
a mode switch circuit having switchable paths that couple the virtual supply node between at least a second supply voltage and a write voltage; wherein
the first and second programmable resistance elements comprise programmable metallization cells (PMCs) with one PMC having an anode coupled to the latch circuit and a cathode coupled to the virtual supply node, and the other PMC having a cathode coupled to the latch circuit and an anode coupled to the virtual supply node; wherein the second voltage is different from the write supply voltage.

32. The IC device of claim 31, wherein
the mode switch circuit further includes a switchable path that couples the virtual supply node to a high impedance connection.

33. The IC device of claim 31, further including
each memory cell is coupled to at least one of a plurality of bit lines;
write circuits coupled to the bit lines and configured to drive bit lines to predetermined bit line write voltages in a write operation in response to write data; and
the virtual supply nodes are drivable to a predetermined supply voltage in a write operation; wherein
application of the bit line write voltage to a bit line and the predetermined supply voltage to the virtual supply node is sufficient to establish a first resistance value in the at least one programmable resistance element.

34. The IC device of claim 31, wherein
each memory cell includes
a first latching active device having a first control terminal coupled to a second latch node and a first controlled impedance path coupled between a first latch node and the at least one programmable resistance element, and
a second latching active device having a second control terminal coupled to the first latch node and a second controlled impedance path coupled to the second latch node.

35. The IC device of claim 31, wherein:
the re-configurable circuit is selected from the group of: a programmable crosspoint connection circuit, a programmable multiplexer, a programmable de-multiplexer, and a programmable logic circuit.

36. The IC device of claim 31, wherein:
each memory cell includes
the latch circuits having transistors formed in a semiconductor substrate, and
the programmable resistance elements are formed over the substrate.

* * * * *